(12) United States Patent
Ushiyama

(10) Patent No.: US 10,103,188 B2
(45) Date of Patent: Oct. 16, 2018

(54) METHOD OF MANUFACTURING SEMICONDUCTOR DEVICE AND SEMICONDUCTOR DEVICE

(71) Applicant: Renesas Electronics Corporation, Tokyo (JP)

(72) Inventor: Yoshitaka Ushiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/658,776

(22) Filed: Jul. 25, 2017

(65) Prior Publication Data

US 2018/0076245 A1 Mar. 15, 2018

(30) Foreign Application Priority Data

Sep. 13, 2016 (JP) ................. 2016-178444

(51) Int. Cl.
*H01L 27/00* (2006.01)
*H01L 27/146* (2006.01)
*H04N 5/225* (2006.01)

(52) U.S. Cl.
CPC .. *H01L 27/14618* (2013.01); *H01L 27/14636* (2013.01); *H01L 27/14683* (2013.01); *H04N 5/2253* (2013.01)

(58) Field of Classification Search
CPC ................................ H01L 27/14618
See application file for complete search history.

(56) References Cited

U.S. PATENT DOCUMENTS

2012/0249822 A1  10/2012  Yoshida et al.
2013/0286592 A1  10/2013  Tsuduki et al.

FOREIGN PATENT DOCUMENTS

JP    2002-289718 A   10/2002
JP    2012-217021 A   11/2012
JP    2013-243341 A   12/2013

*Primary Examiner* — William Harriston
(74) *Attorney, Agent, or Firm* — Mattingly & Malur, PC

(57) ABSTRACT

A performance of a semiconductor device is improved. A method of manufacturing a semiconductor device according to one embodiment includes a step of mounting a cover member via a bonding material on an upper surface of a frame member fixed on a wiring substrate, and a step of curing the bonding material by irradiating the bonding material mounted on the frame member with an ultraviolet ray. The wiring substrate has a base member and an insulating film covering the base member, and the frame member and a semiconductor chip are mounted (fixed) onto an upper surface of the insulating film. The frame member contains glass fibers. Moreover, a roughness of the upper surface of the frame member is equal to or less than a roughness of the upper surface of the insulating film.

16 Claims, 20 Drawing Sheets

METHOD OF MANUFACTURING SEMICONDUCTOR DEVICE AND SEMICONDUCTOR DEVICE

CROSS-REFERENCE TO RELATED APPLICATION

The present application claims priority from Japanese Patent Application No. 2016-178444 filed on Sep. 13, 2016, the content of which is hereby incorporated by reference into this application.

TECHNICAL FIELD OF THE INVENTION

The present invention relates to a method of manufacturing a semiconductor device and a semiconductor device, and relates to a technique effectively applied to a semiconductor device in which a semiconductor chip mounted on a substrate is covered with a cover member.

BACKGROUND OF THE INVENTION

Japanese Patent Application Laid-open Publication No. 2013-243341 (Patent Document 1) has described an electronic component in which an electronic device mounted on a substrate is covered with a frame member and a cover member. Further, Patent Document 1 has described a photocurable resin, a thermosetting resin or others, as examples of a joining material for bonding the frame member and the cover member.

Moreover, Japanese Patent Application Laid-open Publication No. 2002-289718 (Patent Document 2) has described a solid-state image pickup apparatus in which a solid-state image pickup element mounted on a substrate is covered with a frame member and a cover member. Patent Document 2 has described that an upper surface of the frame member and the cover member are bonded to each other via an ultraviolet-ray curable resin. In Patent Document 2, a glass epoxy resin is included in exemplified materials for the frame member.

Furthermore, Japanese Patent Application Laid-open Publication No. 2012-217021 (Patent Document 3) has described a solid-state image pickup apparatus in which a solid-state image pickup element mounted on a substrate is covered with a frame member and an optical member (cover member). Patent Document 3 has described that the frame member and the substrate are bonded to each other by a thermosetting resin and that the frame member and the optical member are bonded to each other by an ultraviolet-ray curable resin.

SUMMARY OF THE INVENTION

For example, as a packaging mode of an image sensor or others, a semiconductor device in which a semiconductor chip mounted on a wiring substrate is covered with a cover member such as a glass plate has been proposed. When a semiconductor chip having a light-receiving part such as an image sensor is used, the following configurations are required for the semiconductor device. That is, the configurations are a configuration capable of irradiating the light-receiving part with visible light and a configuration of protecting the semiconductor chip from an external force.

As a structure functioning as both of the above-described two configurations, the following semiconductor device is preferable. That is, the semiconductor chip is mounted inside the frame member fixed to the wiring substrate, that is, within a region surrounded by the frame member when seen in a plan view. Moreover, the semiconductor chip is covered with a cover member that is fixed onto the frame member and that is comprised of a visible light transmissive material such as a glass plate. In the semiconductor device having the above-described structure, the frame member and the cover member can be independently manufactured, and therefore, the semiconductor device is also preferable in terms of production efficiency.

However, according to studies by the inventor of the present invention, it has been found that even the semiconductor device having the above-described structure has still some room for improvements in terms of enhancing the reliability of the product and others. For example, in the structure in which the frame member and the cover member are fixed onto the wiring substrate, if a bonding material and a member are peeled off from each other at a part of a bonding interface between the respective members, the peeling off becomes a cause of reduction in the reliability of the semiconductor chip in some cases.

Other object and novel characteristics will be apparent from the description of the present specification and the accompanying drawings.

A method of manufacturing a semiconductor device according to one embodiment includes a step of fixing, via a bonding material, a cover member onto an upper surface of a frame member fixed on a wiring substrate, and a step of curing the bonding material by irradiating the bonding material fixed on the frame member with ultraviolet ray. The above-described wiring substrate is provided with a base member and an insulating film covering the base member, and the frame member and a semiconductor chip are fixed on an upper surface of the insulating film. The above-described frame member contains glass fibers. Moreover, roughness of the upper surface of the frame member is the same as roughness of the upper surface of the insulating film, or is smaller than the roughness of the upper surface of the insulating film.

According to the above-described embodiment, a performance of the semiconductor device can be improved.

BRIEF DESCRIPTIONS OF THE DRAWINGS

Figure 20:
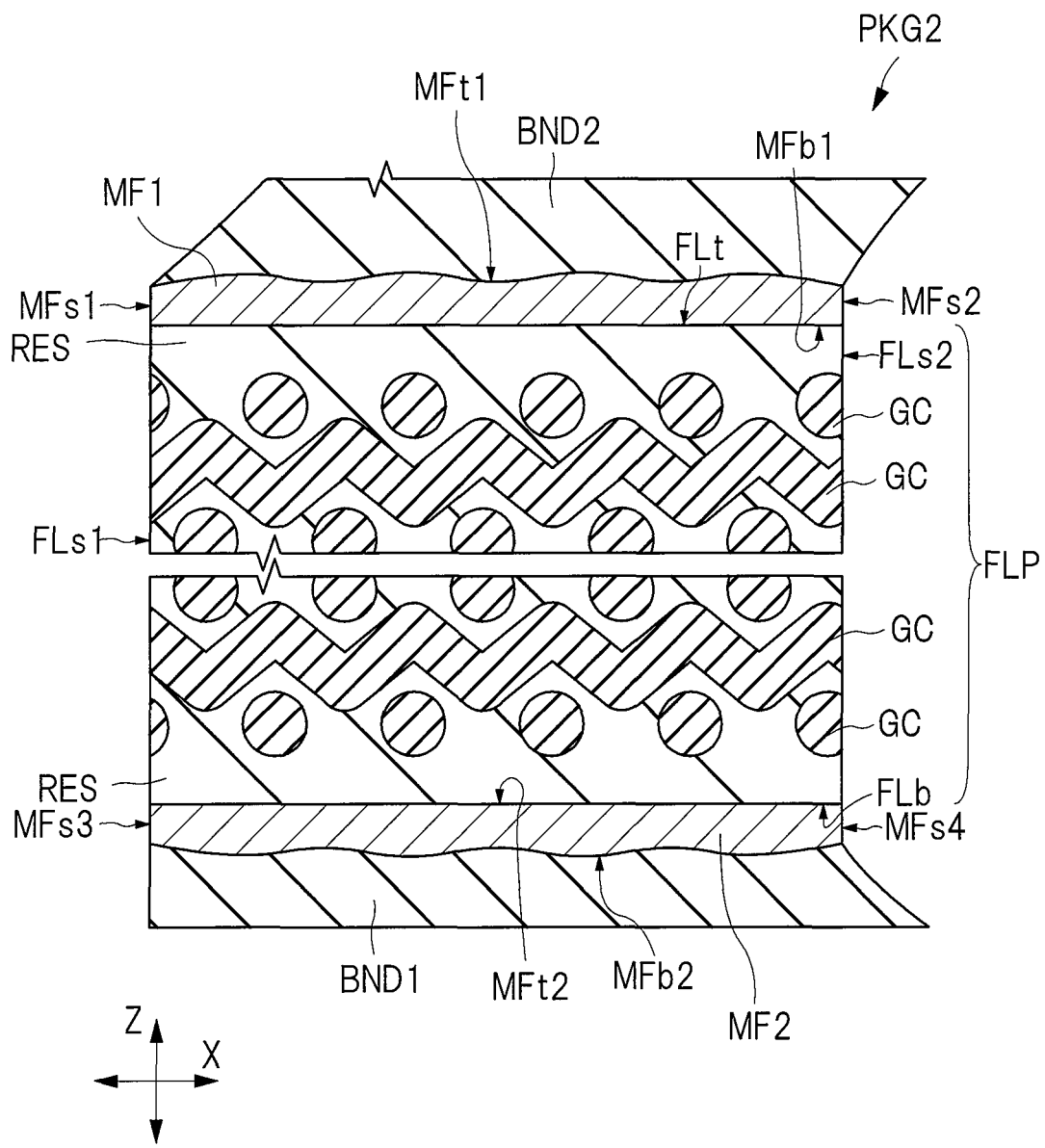
FIG. 20 is an enlarged cross-sectional view of an upper surface and a lower surface of the frame member shown in FIG. 19.
Figure 22:
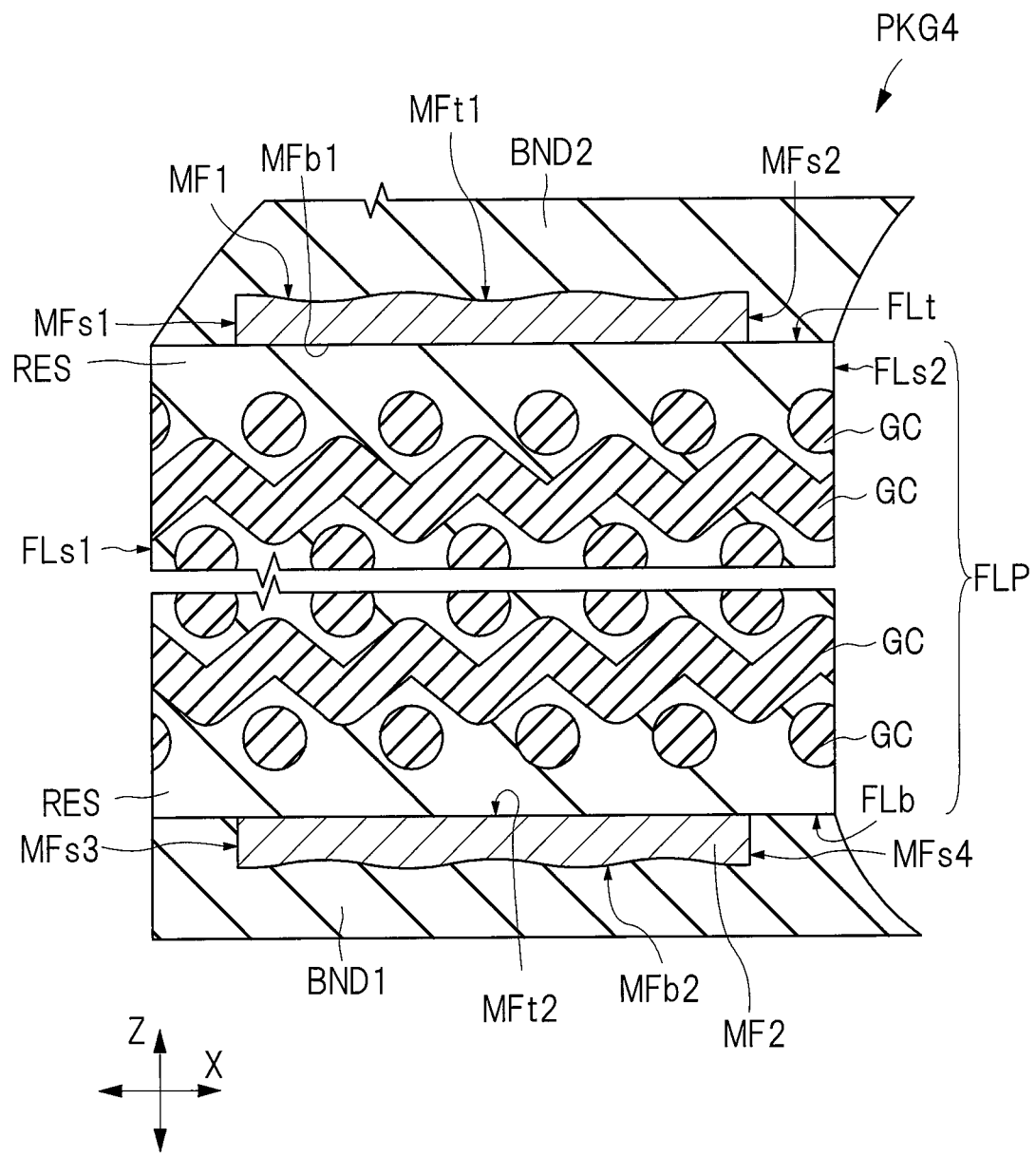
Figure 23:
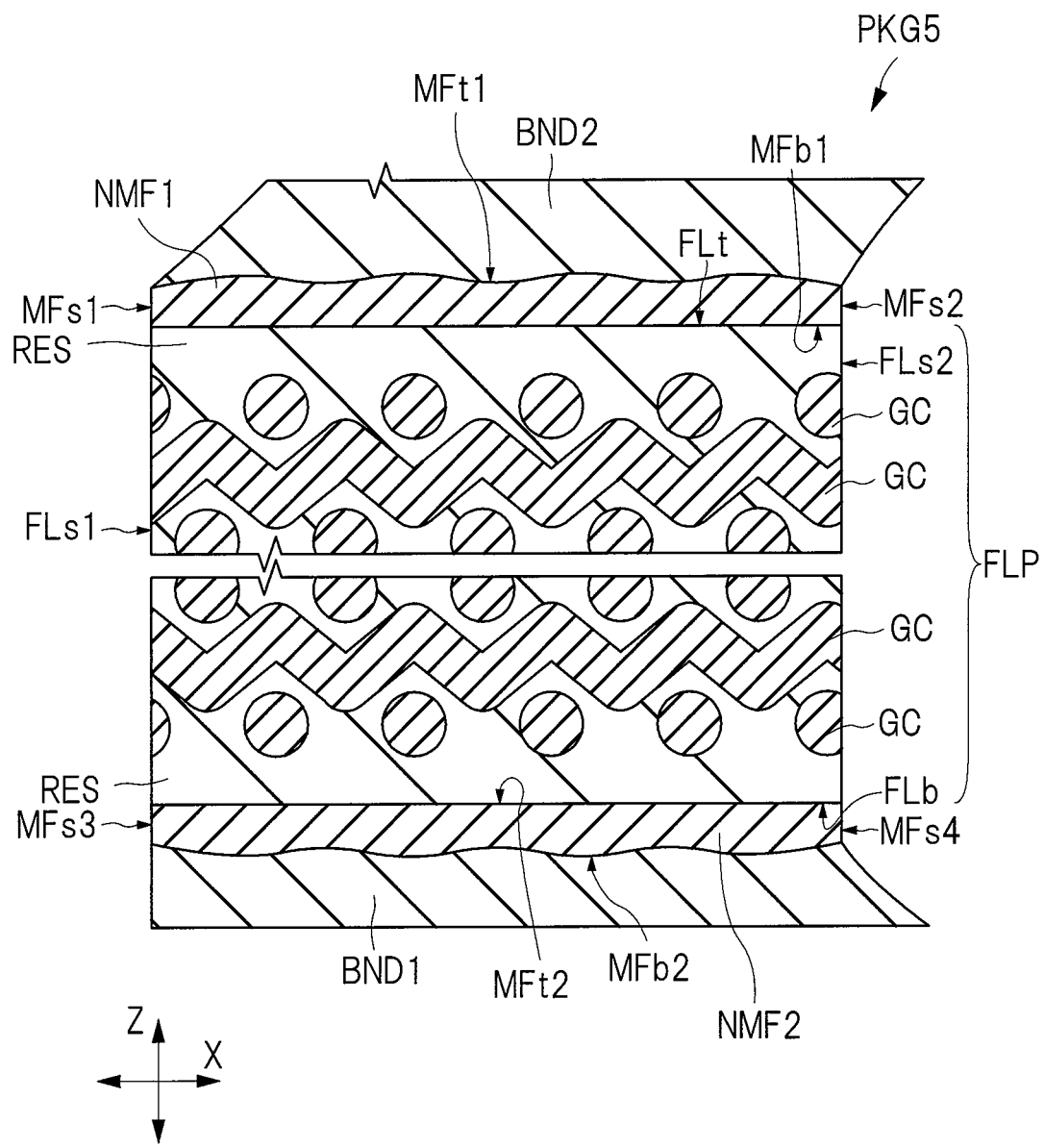

FIG. 22 is an enlarged cross-sectional view of peripheries of the upper surface and the lower surface of the frame member included in the semiconductor device according to another modified example of FIG. 20; and FIG. 23 is an enlarged cross-sectional view of peripheries of the upper surface and the lower surface of the frame member included in the semiconductor device according to still another modified example of FIG. 20.

DESCRIPTIONS OF THE PREFERRED EMBODIMENTS (Explanation of Description Form, Basic Term and Method in Present Application)

In the present application, the embodiments will be described in a plurality of sections or others if needed when required as a matter of convenience. However, these sections or embodiments are not irrelevant to each other unless otherwise stated, and each part or one of one example relates to a specific part, a part or the entire of the other example as a modification example or others, regardless of before and after the description. Also, in principle, the repetitive description of the same part is omitted. Further, each element in the embodiment is not indispensable unless otherwise described to be particularly so, logically limited to the number, and described to be clearly so from the contexts.

Similarly, even when "X comprised of A" or others is described for materials, compositions, and others in the description of the embodiment and others, the one containing other components than A is not eliminated unless otherwise specified and clearly to be so from the contexts. For example, as to the component, "X comprised of A" means "X containing A as a main component" or others. For example, the component means "X containing A as a main component" or others. For example, it is needless to say that a "silicon material" and others includes not only pure silicon but also SiGe (silicon germanium) or other multicomponent alloy containing silicon as a main component, or a member containing other additives or others. Also, gold plating, a Cu layer, nickel plating, and others include not only pure material but also members containing gold, Cu, nickel, and others as a main component, respectively, unless otherwise specified not to be so.

Further, even when a specific numerical value and numerical amount are mentioned, they may be numerical values that excess the specific numerical values or smaller than the specific numerical values unless otherwise specified not to be so, logically limited to the number, and clearly described to be so from the contents.

Still further, in each drawing of the embodiment, the same or similar parts are denoted by the same or similar symbol or reference number, and the description thereof is not repeated.

Moreover, in the present application, a term "upper surface" or "lower surface" is used in some cases. However, since the packaging mode of the semiconductor package includes various modes, for example, the upper surface is arranged to be lower than the lower surface after packaging the semiconductor package in some cases. In the present application, explanations will be made in an assumption that a packaged surface for the semiconductor package is the lower surface and that an opposite surface to the packaged surface is the upper surface.

Also, in the attached drawings, hatching or others is omitted even in a cross-sectional view in a conversely complicated case or in a case in which a space is clearly distinguished therefrom. In respect to this, in a case in which it is clear from the description or others, an outline of the background is omitted even in a hole which is closed in a plan view. Further, hatching or a dot pattern is added to a drawing even if the drawing is not a cross-sectional view in order to explicitly illustrate so as not to be the space or explicitly illustrate a boundary between regions.

First Embodiment

In the present embodiment, as an example of a semiconductor device in which a semiconductor chip is mounted on a wiring substrate and which is surrounded by a frame member and a cover member, an image sensor package in which a semiconductor chip serving as an image sensor is mounted on a wiring substrate will be exemplified and explained.

<Semiconductor Device>

Figure 1:
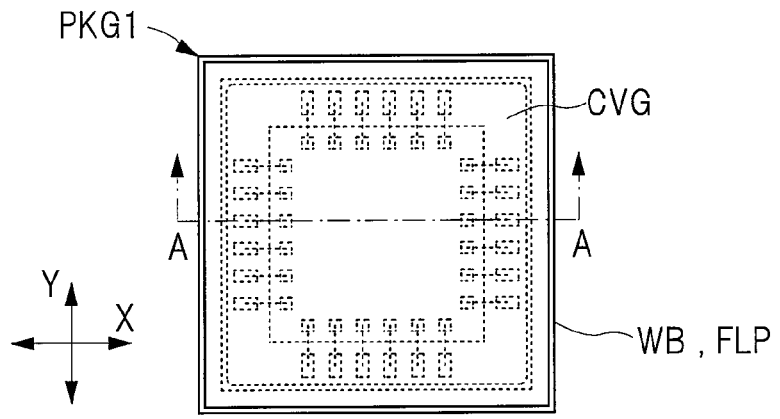
FIG. 1 is a plan view of a semiconductor device according to one embodiment.
Figure 2:
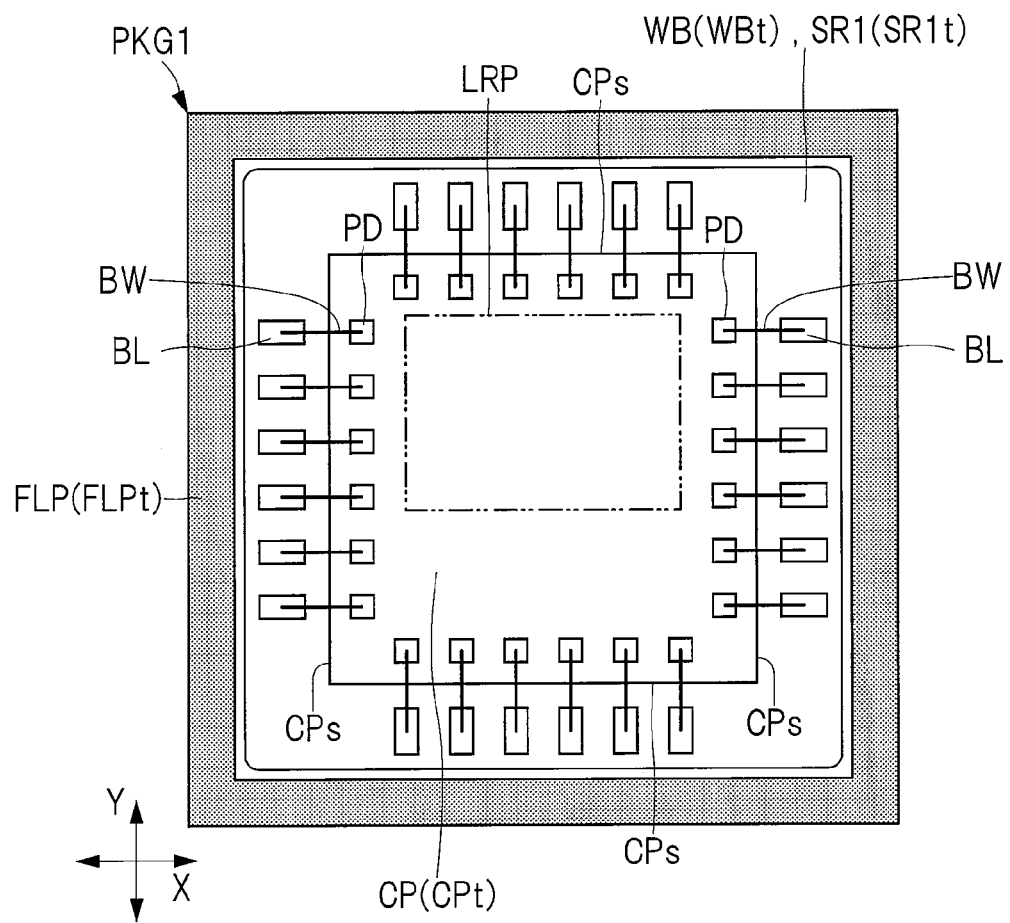
FIG. 2 is a plan view showing an internal structure of the semiconductor device shown in FIG. 1.
Figure 3:
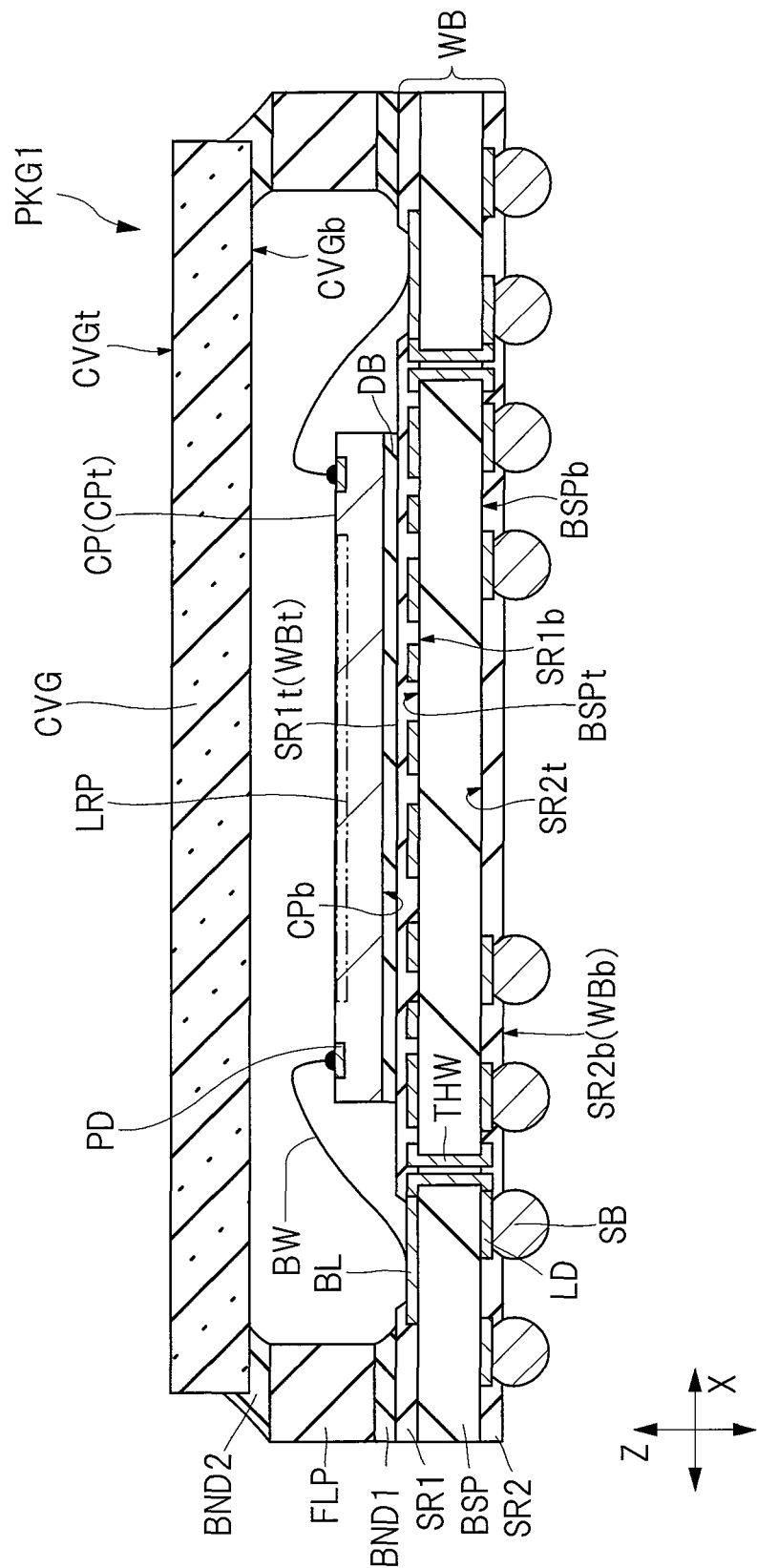
FIG. 3 is a cross-sectional view taken along a line A-A of FIG. 1.
Figure 4:
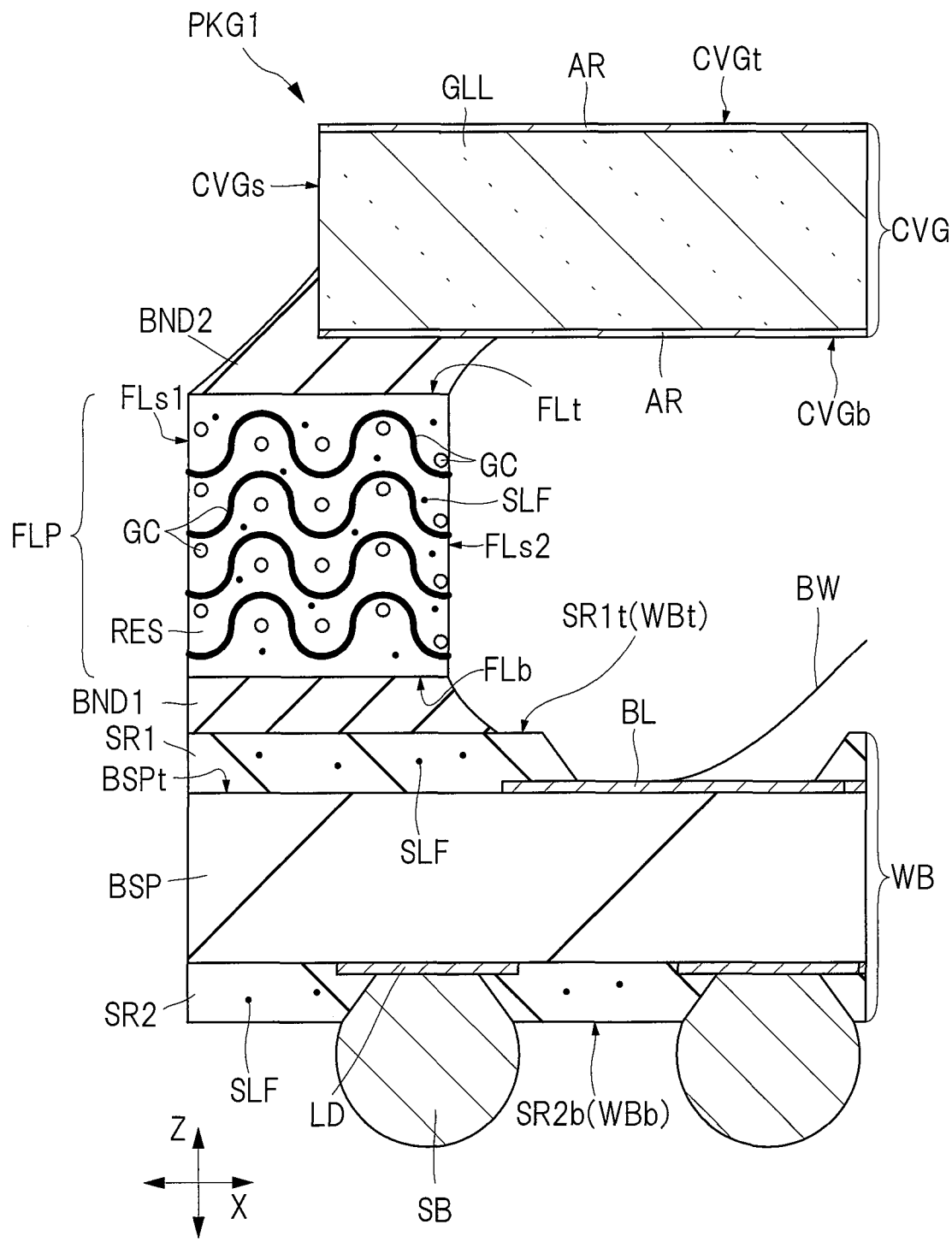
FIG. 4 is an enlarged cross-sectional view of a periphery of a frame member shown in FIG. 3.

First, referring to FIG. 1 and FIG. 3, a configuration of a semiconductor device PKG1 according to the present embodiment will be explained. The semiconductor device PKG1 according to the present embodiment is provided with a wiring substrate WB and a semiconductor chip CP mounted on the wiring substrate WB. FIG. 1 is a plan view of the semiconductor device according to the present embodiment, and FIG. 2 is a plan view showing an internal structure of the semiconductor device shown in FIG. 1. Moreover, FIG. 3 is a cross-sectional view taken along a line A-A of FIG. 1. FIG. 4 is an enlarged cross-sectional view of a periphery of a frame member shown in FIG. 3. Note that FIG. 2 and FIG. 3 show a region of a light-receiving part formed on a front surface CPt side of the semiconductor chip CP, the region being surrounded by a two-dot chain line and denoted by a symbol LRP. Furthermore, in FIG. 2, illustrations of a cover member CVG and a bonding material BND2 for fixing the cover member CVG onto a frame member FLP shown in FIG. 3 are omitted. FIG. 4 schematically shows glass fibers GC contained in the frame member FLP, and hatching of the frame member FLP is omitted.

As shown in FIG. 1 to FIG. 3, the semiconductor device PKG1 of the present embodiment has the wiring substrate WB and the frame member (support member, spacer, dam) FLP that is fixed onto the wiring substrate WB. Moreover, the semiconductor device PKG1 has the semiconductor chip CP (see FIG. 2 and FIG. 3) mounted inside the frame member FLP and the cover member (glass plate, transparent plate) CVG (see FIG. 1 and FIG. 3) fixed on the frame member FLP such that the semiconductor chip CP is covered.

As shown in FIG. 3, the wiring substrate (substrate) WB has an upper surface WBt serving as a chip mounting surface and a lower surface WBb that is opposite to the upper surface WBt and that serves as a packaging surface. In the present embodiment, each of the upper surface WBt and the lower surface WBb has a square shape. Moreover, the wiring substrate WB has the base member BSP containing an insulating material, an insulating film (solder resist film) SR1 covering the upper surface BSPt of the base member BSP and an insulating film (solder resist film) SR2 covering the lower surface BSPb of the base member BSP.

The base member BSP has an upper surface (surface, main surface) BSPt and a lower surface (surface, main surface) BSPb located opposite to the upper surface BSPt. The base member BSP is a member comprised of an insulating material, and has, for example, a single layer structure in an example shown in FIG. 3. The insulating layer forming the base member BSP has glass fibers. More specifically, the insulating film is formed by, for example, curing a so-called prepreg material formed by impregnating a glass fiber sheet with an epoxy-based thermosetting resin. The insulating material formed by curing the prepreg material is referred to as "glass epoxy" in some cases. When the base member BSP contains the glass fibers, the strength of the wiring substrate WB can be improved. Note that the base member BSP of the wiring substrate WB shown in FIG. 3 is an insulating layer having a single layer structure, and includes various applicable modified examples. For example, the base member BSP may have a structure in which a plurality of insulating layers and a plurality of wiring layers are alternately stacked. In this case, the number of wiring layers included in the wiring substrate WB can be made such that a multi-layer structure is provided. Moreover, when the base member BSP has a plurality of insulating layers, some of the plurality of insulating layers may contain the glass fibers, and the other may not contain the glass fibers. Furthermore, depending on the strength required for the wiring substrate WB, the insulating layers forming the base member BSP may not contain the glass fibers in some cases.

Moreover, on the upper surface BSPt of the base member BSP, a plurality of terminals (bonding leads, wire connecting parts) BL and an insulating film (solder resist film, protective film) SR1 are disposed. The insulating film SR1 is an insulating film covering most of the upper surface BSPt of the base member BSP, and has a lower surface (surface, main surface, rear surface) SR1b that faces to the upper surface BSPt and an upper surface (surface, main surface, front surface) SR1t that is opposite to the lower surface SR1b as shown in FIG. 3. The insulating film SR1 functions as a protective film for protecting a wiring pattern formed on the uppermost surface of the wiring substrate WB. Since the insulating film SR1 is the film formed on the uppermost surface of the wiring substrate WB, the upper surface SR1t of the insulating film SR1 serves as also the upper surface WBt of the wiring substrate WB.

Moreover, an opening is formed in the insulating film SR1. From the opening, the plurality of terminals BL are exposed. Each terminal BL is an internal interface terminal of the semiconductor device PKG1 to be connected to the semiconductor chip CP via the wire BW. The plurality of terminals BL are each comprised of a metal material such as copper, and are a patterned conductor pattern. Furthermore, in an example shown in FIG. 2, the plurality of terminals BL are arranged on the periphery of the semiconductor chip CP. Note that the example shown in FIG. 2 shows a case in which the openings for individually exposing the plurality of terminals BL respectively therefrom are formed on the insulating film SR1. However, a size and a shape of the opening includes various modified examples. For example, a large opening for collectively exposing the plurality of adjacent terminals BL therefrom may be formed in the insulating film SR1.

Furthermore, as shown in FIG. 3, on the lower surface BSPb of the base member BSP, a plurality of terminals (lands, solder ball connecting parts) LD and an insulating film (solder resist film, protective film) SR2 are disposed. The insulating film SR2 is an insulating film covering most of the lower surface BSPb of the base member BSP, and has an upper surface (surface, main surface, front surface) SR2t that faces to the lower surface BSPb and a lower surface (surface, main surface, front surface) SR2b that is opposite to the upper surface SR2t as shown in FIG. 3. The insulating film SR2 functions as a protective film for protecting a wiring pattern formed on the lowermost surface of the wiring substrate WB. Since the insulating film SR2 is the film formed on the lowermost layer of the wiring substrate WB, the lower surface SR2b of the insulating film SR2 serves as also the lower surface WBb of the wiring substrate WB.

Moreover, an opening is formed in the insulating film SR2. From the opening, the plurality of terminals LD are exposed. Each terminal LD is an external interface terminal of the semiconductor device PKG1 to be connected to an external device of the semiconductor device PKG1 via the solder ball SB. The plurality of terminals LD are each comprised of a metal material such as copper, and are a patterned conductor pattern. The terminals LD are electrically connected to the terminals BL formed on the upper surface BSPt via a wiring (interlayer conductor path, through hole wiring, via wiring) THW that is an interlayer conductive path for electrically connecting the wiring layer of the upper surface BSPt and the wiring layer of the lower surface BSPb of the base member BSP. The plurality of terminals LD and the plurality of terminals BL are electrically connected to each other via the wiring THW. Moreover, solder balls SB are joined to the plurality of terminals LD, respectively. As similar to the terminals LD, each of the plurality of solder balls SB can be regarded as the external interface terminal of the semiconductor device PKG1. Note that an example shown in FIG. 3 shows a case in which openings for individually exposing the plurality of terminals LD respectively are formed in the insulating film SR2. However, a size and a shape of each opening includes various modified examples. For example, a large opening for collectively exposing the plurality of adjacent terminals LD therefrom may be formed in the insulating film SR2.

As described above, each of the insulating film SR1 and the insulating film SR2 functions as a protective film for covering the conductor pattern such as a wiring pattern formed on the uppermost layer or the lowermost layer of the wiring substrate WB. For this reason, from a viewpoint of preventing a gap from being generated between the base member BSP and the insulating films SR1 and SR2, the insulating film SR1 and the insulating film SR2 are preferably comprised of a material softer than a material of the base member BSP. If the insulating film SR1 (or the insulating film SR2) has flexibility at least when being disposed on the base member BSP, this is made tightly in contact with the upper surface BSPt or the lower surface BSPb of the base member BSP in accordance with irregularities derived from the conductor pattern. Moreover, since the strength of the wiring substrate WB is mainly determined by the strength of the base member BSP, a strength as large as the strength of the base member BSP is not required for the insulating film SR1 and the insulating film SR2. Therefore, in the present first embodiment, the insulating film SR1 and the insulating film SR2 each comprised of a resin containing no glass fibers are used. For this reason, the degree of flatness of each of the upper surface SR1t of the insulating film SR1 and the lower surface SR2b of the insulating film SR2 (particularly the degree of flatness of a part that do not cover the conductor pattern formed on each of the upper surface BSPt and the lower surface BSPb of the base member BSP) is higher than the degree of flatness of the surface of the resin containing glass fibers. In other words, each of the insulating film SR1 and the insulating film SR2 comprised of the resin containing no glass fibers can have a smaller surface roughness value (be smaller in the roughness) than a value of the resin containing the glass fibers. For this reason, the roughness of each of the upper surface SR1t of the insulating film SR1 and the lower surface SR2b of the insulating film SR2 (particularly a roughness of a part that does not cover the conductor pattern formed on each of the upper surface BSPt and the lower surface BSPb of the base member BSP) is smaller than the surface roughness of the resin containing the glass fibers. Note that the composition of the resin forming each of the insulating film SR1 and the insulating film SR2 is not particularly limited, and, for example, an organic resin that is generally commercialized as a solder resist can be used. The resin utilized as the solder resist includes, for example, a photosensitive polymer having a carboxyl group, a cross-linking agent (such as epoxy resin), various curing initiators (photo-curing initiators or thermo-setting initiators), fillers and others. Moreover, in the present first embodiment, the explanation has been made about the usage of the resin containing no glass fibers as the insulating film SR1 (or the insulating film SR2). However, the resin containing the glass fibers may be used as the insulating film SR1 (or the insulating film SR2). However, the upper surface SR1t of the insulating film SR1 is a component mounting surface (component fixing surface) on which components such as the semiconductor chip CP and the frame member FLP and others are mounted (fixed). Therefore, from the viewpoint of stably fixing the components on the upper surface SR1t, the upper surface SR1t of the insulating film SR1 is as preferably flat as in the case of using the resin containing no glass fibers even when the resin containing the glass fibers is used as the insulating film SR1.

Moreover, on the upper surface WBt of the wiring substrate WB, the semiconductor chip CP is mounted. The semiconductor chip CP has a front surface (main surface, upper surface) CPt, a rear surface (main surface, lower surface) CPb opposite to the surface CPt and a side surface CPs (see FIG. 2) located between the surface CPt and the rear surface CPb as shown in FIG. 3, and has a square external shape having a plane area that is smaller than that of the wiring substrate WB when seen in a plan view as shown in FIG. 2.

The semiconductor chip CP has a plurality of pads (electrode pads, bonding pads, chip electrodes) PD formed on the front surface CPt. In an example shown in FIG. 2, the plurality of pads PD are arranged along four sides (along side surfaces CPs) forming outer edges of the front surface CPt. Moreover, in an example shown in FIG. 3, the semiconductor chip CP is mounted on the upper surface WBt via the bonding material DB while the rear surface CPb faces to the upper surface WBt of the wiring substrate WB. This mounting system is referred to as "face-up mounting system".

The semiconductor chip CP (more specifically, the semiconductor substrate of the semiconductor chip CP) is comprised of, for example, silicon (Si). Moreover, an insulating film covering the base member and the wiring of the semiconductor chip CP is formed on the front surface CPt, and each of the surfaces of the plurality of pads PD is exposed from the insulating film in the opening formed on the insulating film. Moreover, each of the plurality of pads PD is comprised of a metal such as aluminum (Al) in the present embodiment.

In an example shown in FIG. 2 and FIG. 3, the semiconductor chip CP is a so-called image sensor chip having a light-receiving part LRP on which a plurality of image sensor elements (light-receiving elements) formed on the front surface CPt side are arranged. The image sensor element is, for example, a solid-state image pickup element that utilizes a CMOS (Complementary Metal Oxide Semiconductor) for reading an electric signal that is output from a photodiode (photoelectric conversion circuit). The plurality of image sensor elements arranged in the light-receiving part LRP on the front surface CPt side of the semiconductor chip CP are electrically connected to the plurality of pads PD formed on the peripheral edge portion of the front surface CPt.

The plurality of pads PD of the semiconductor chip CP are electrically connected to the plurality of terminals BL of the wiring substrate WB via the plurality of wires (conductive members) BW each comprised of a metal material such as gold (Au) or copper (Cu). One end of each of the wires BW is joined to the pad PD of the semiconductor chip CP, and the other end thereof is joined to the terminal BL of the wiring substrate WB. In a case of a semiconductor package having a sensor chip such as an image sensor chip, it is required to set the sensor part to be visible often. For this reason, in the example shown in FIG. 2 and FIG. 3, the semiconductor chip CP is mounted by the face-up mounting system such that the semiconductor chip CP and the wiring substrate WB are electrically connected with each other via the wire BW.

However, as a modified example of the present embodiment, the light-receiving part LRP constituted by the plurality of image sensor elements may be formed on the rear surface CPb side of the semiconductor chip CP. In this case, in order to bring the rear surface CPb to be visible, the semiconductor chip CP is mounted on the wiring substrate WB while the surface CPt side faces to the upper surface WBt of the wiring substrate WB. Such a mounting system is referred to as "face-down packaging system". Moreover, in this case, in a thickness direction (Z-direction shown in FIG. 3) of the semiconductor device PKG1, the pads PD of the semiconductor chip CP and the plurality of terminals BL are overlapped with each other such that they are electrically connected with each other via a bump electrode not shown.

A method of electrically connecting the pads PD of the semiconductor chip CP and the terminals BL of the wiring substrate WB via the bump electrode as described above is referred to as "flip-chip connection system".

Moreover, as shown in FIG. 2, in a plan view seen from the upper surface WBt side of the wiring substrate WB, the frame member FLP is fixed (disposed) on the periphery of the semiconductor chip CP, and the cover member CVG shown in FIG. 1 is fixed on the frame member FLP. From the viewpoint of improving the reliability of the semiconductor device PKG1, it is preferable to protect the pads PD and the light-receiving part LRP of the semiconductor chip. Moreover, when the wires BW are connected to the pads PD as described in the present embodiment, it is also preferable to protect the wires BW in order to suppress the wires BW from being deformed by an external force.

However, in the case of the semiconductor device PKG1, it is required to irradiate the light-receiving part LRP with light, and therefore, it is difficult to adopt a generally-used resin sealing method for protecting the wires BW and the semiconductor chip CP. Therefore, in the semiconductor device PKG1, the periphery of the semiconductor chip CP is protected by using the frame member FLP as shown in FIG. 2, and the semiconductor chip CP is covered with the led member CVG as shown in FIG. 3, such that the surface CPt side of the semiconductor chip CP is protected by the cover member CVG.

As shown in FIG. 4, the frame member FLP has a lower surface (surface, main surface) FLb that faces to the upper surface SR1t of the insulating film SR1 and an upper surface (surface, main surface) FLt that is opposite to the lower surface FLb. The frame member FLP is fixed onto the wiring substrate WB via a bonding material BND1 while the upper surface SR1t of the insulating film SR1 and the lower surface FLb of the frame member FLP face to each other. Although described in detail later, the bonding material BND1 is a so-called thermosetting resin containing a thermosetting resin material such as an epoxy-based resin as a main component.

Moreover, the frame member FLP has an outer side surface FLs1 and an inner side surface FLs2 that are located between the upper surface FLt and the lower surface FLb in a thickness direction (Z-direction shown in FIG. 4) of the frame member FLP. When seen in a plan view, the outer side surface FLs1 is a side surface that is located closer to the peripheral edge of the wiring substrate WB than the inner side surface FLs2. Moreover, the inner side surface FLs2 is a surface that faces to a member such as the semiconductor chip CP (see FIG. 3). As shown in FIG. 2 and FIG. 3, the semiconductor chip CP is mounted on a region surrounded by the frame member FLP when seen in a plan view. The frame member FLP is disposed such that the periphery of the semiconductor chip CP is continuously surrounded.

Moreover, as shown in FIG. 4, the frame member FLP contains the glass fibers as similar to the above-described base member BSP. More specifically, the frame member is formed by curing a so-called prepreg material formed by impregnating a glass fiber sheet with a resin RES that is an epoxy-based thermosetting resin, the glass fiber sheet being formed by shaping the glass fibers GC to have a sheet shape. Since the frame member FLP contains the glass fibers GC, the support strength of the cover member CVG can be improved. Although described in detail later, the shape of the frame member FLP is formed by removing the members (the glass fibers GC and the cured resin RES) inside the frame shape after the prepreg material has been cured. For this reason, from each of the outer side surface FLs1 and the inner side surface FLs2 of the frame member FLP, a part of the glass fibers GC is exposed. On the other hand, from the upper surface FLt and the lower surface FLb of the frame member FLP, no glass fibers GC are exposed.

Moreover, the cover member CVG has a lower surface CVGb that faces to the upper surface WBt of the wiring substrate WB and an upper surface CVGt that is opposite to the lower surface CVGb. Moreover, in the thickness direction (Z-direction in FIG. 4) of the cover member CVG, the cover member CVG has a side surface CVGs located between the upper surface CVGt and the lower surface CVGb.

As shown in FIG. 3, the cover member CVG is mounted on the upper surface FLt of the frame member FLP via a bonding material BND2 such that the lower surface CVGb faces to the upper surface SR1t of the insulating film SR1 and the front surface CPt of the semiconductor chip CP. The bonding material BND2 is made tightly in contact with the upper surface FLt of the frame member FLP. In other words, the bonding material BND2 and the upper surface FLt of the frame member FLP are tightly made in contact with each other. Moreover, although described in detail later, the bonding material BND2 is a so-called ultraviolet-ray curable resin that contains a resin component as a main component, that is cured when irradiated with an ultraviolet ray.

The cover member CVG is a glass plate that is transparent relative to visible light, such that the light-receiving part LRP (see FIG. 2) of the semiconductor chip CP (see FIG. 2) can be visible from the upper surface CVGt of the cover member CVG. For example, in the example shown in FIG. 3 and FIG. 4, optical characteristics of the cover member CVG are as follows. That is, the cover member CVG has an absolute reflectance of 1% or less relative to light in a wavelength range of 400 nm to 700 nm. Moreover, the cover member CVG has an absolute reflectance of 5% or less relative to light in a wavelength range of 450 nm to 650 nm.

Moreover, the cover member CVG may be formed by a glass layer having a one-layer structure, or may be formed such that various optical functional films for improving the optical characteristics of the cover member CVG are stacked. For example, in the cover member CVG shown in FIG. 4, a reflection preventive film AR is formed on each of the upper surface and the lower surface of a glass layer GLL serving as a base member. The reflection preventive film AR is a thin film having a reflectance different from that of the glass layer GLL, and is comprised of an inorganic material. The reflection preventive film AR is formed such that each of the upper surface and lower surface of the glass layer GLL is covered. By stacking the reflection preventive film AR having a reflectance different from that of the glass film GLL, a phase difference is caused in reflection light rays reflected by an interface among the respective members. The reflection light rays are interfered such that they cancel with one another by this phase difference, and therefore, the entire reflectance of the cover member CVG can be reduced.

Moreover, as a modified example of the cover member CVG, not only the above-described reflection preventive film AR but also various optical functional films may be formed. For example, an inorganic film (hereinafter, referred to as IR filter film) having characteristics of reflecting or absorbing infrared ray may be formed on either one or both of the upper surface CVGt and the lower surface CVGb of the cover member CVG. Furthermore, for example, the reflection preventive film AR may be formed on either one of the upper surface CVGt and the lower surface CVGb of the cover member CVG, and the IR filter film may be formed on the other one. For example, the glass layer GLL may be exposed from either one of the upper surface CVGt and the lower surface CVGb of the cover member CVG. Moreover, another modified example of the cover member CVG may be a plate member (not shown) comprised of a resin material (transparent resin material) that is transparent relative to visible light without forming the glass layer. This case preferably provides transparency relative to the visible light as large as transparency in a case of usage of the above-described glass plate.

<Details of Bonding Portion Between Cover Member and Frame Member>

Next, a structure of a bonding portion between the frame member FLP and the cover member CVG will be explained. As described above, in the semiconductor device PKG1, the semiconductor chip CP is protected by surrounding the periphery and the upper portion of the semiconductor chip by the frame member FLP and the cover member CVG. However, according to the studies by the inventor of the present application, it is found that the cover portion CVG in a bonded and fixed portion of the cover member CVG onto the frame member FLP is peeled off from the frame member FLP, depending on a state of the bonding interface between the bonding material BND2 and the frame member FLP. Hereinafter, the findings and the means for solving the problem obtained by the studies by the inventor of the present application will be explained.

As similar to the semiconductor device PKG1, the inventor of the present application has evaluated the image sensor package in which the semiconductor chip serving as the image sensor is mounted on the wiring substrate through a reflow heat resistance test. The reflow heat resistance test was performed in the following method. First, as a pre-treatment, an image sensor package wrapped as similar to a product was taken out of a wrapping material, and was left at a predetermined environmental condition (temperature: 125° C., time: 24 hours or longer). Next, the image sensor package was further left at a temperature of 30° C. under a humidity of 60% for 48 hours, 72 hours, or 168 hours. Next, a heating process in an assumption of a reflow process at the time of packaging was performed to the pre-treated image sensor package. The heating condition or others is set by using a condition such as solder to be used at the time of packaging, and a temperature profile to bring a temperature to, for example, about 260° C. was performed repeatedly a plurality of times (for example, about three times).

As a result of the above-described reflow heat resistance test on a plurality of image sensor packages, it has been confirmed that the bonding material for bonding the cover member and the frame member is peeled off in some of the image sensor packages. Therefore, the inventor of the present application analyzed the peeled packages, and obtained the following findings. That is, it has been found that the above-described peeling was caused in the vicinity of the bonding interface between the bonding material and the frame member. Moreover, for the peeled package, it has been found that a large number of small bubbles are formed on the peeled bonding interface and in the bonding material.

As a result of further studies made by the inventors of the present application based on the above-described findings, the above-described peeling is considered to be caused by the following mechanism. That is, when the glass fibers contained in the frame member absorb moisture, the moisture is vaporized in the reflow process. At this time, while a gas (water vapor) generated by the vaporization of the moisture in the vicinity of the side surface of the frame member is discharged outside of the frame member from the side surface of the frame member, a gas (water vapor) generated by the vaporization of the moisture that has infiltrated into the frame member (that is at a position distant from the side surface) travels in a direction toward the upper surface of the frame member. At this time, the gas (water vapor) generated by the vaporization of the moisture is discharged from a portion of the upper surface of the frame member where the glass fibers are exposed from the resin or a portion thereof where the thickness of the resin covering the glass fibers is thin. Then, the water vapor is accumulated on the bonding interface between the bonding material and the frame member, and as a result, the above-described peeling is caused at the portion where the water vapor is accumulated. Moreover, a large number of bubbles confirmed by the inventors of the present application are considered to be an evidence of the vaporization of the moisture from the upper surface side of the frame member.

Figure 5:
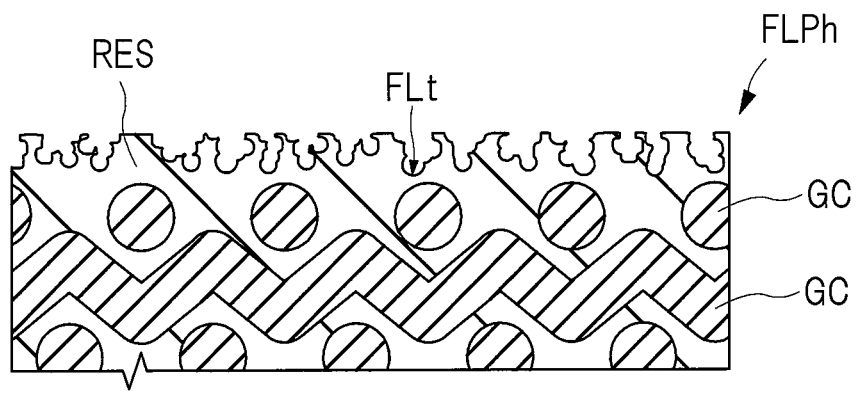
FIG. 5 is an enlarged cross-sectional view of an upper surface of a frame member according to a study example relative to the embodiment.
Figure 6:
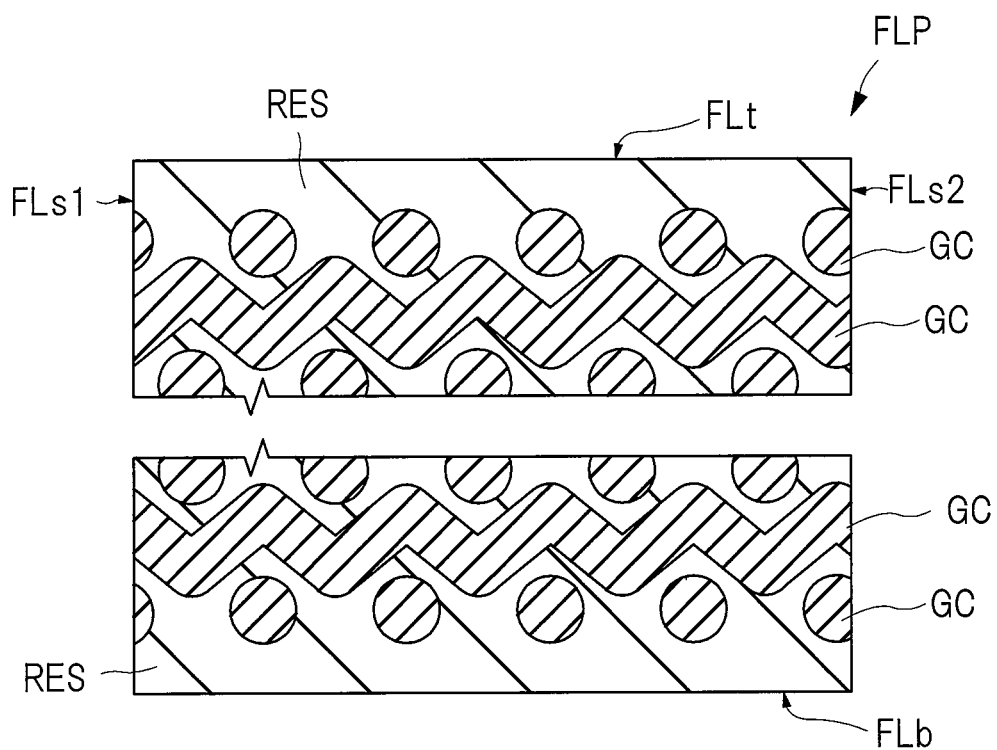
FIG. 6 is an enlarged cross-sectional view of an upper surface and a lower surface of the frame member shown in FIG. 4.

Here, with reference to FIG. 5 and FIG. 6, a relation between the roughness of the upper surface of the frame member and the infiltration of the water vapor into the upper surface of the frame member will be described. FIG. 5 is an enlarged cross-sectional view of the upper surface of the frame member according to a study example of the present embodiment. FIG. 6 is an enlarged cross-sectional view showing the upper surface and the lower surface of the frame member shown in FIG. 4. In the case of the image sensor package studied by the inventors of the present embodiment as shown in FIG. 5, the roughness (surface roughness) of the upper surface FLt of the frame member FLPh is large. This is a configuration intended to improve the bonding strength between the frame member FLPh and the bonding material by increasing the bonding area between the upper surface FLt of the frame member FLPh and the bonding material. However, when attention is paid to the thickness of the resin RES in the vicinity of the upper surface FLt of the frame member FLPh, in other words, to the distance from the glass fibers GC to the upper surface FLt of the frame member FLPh, there is a portion where the thickness of the resin RES is thin in the case of the frame member FLPh shown in FIG. 5. In the example shown in FIG. 5, a large number of holes are formed on the upper surface FLt of the frame member FLPh, and each bottom surface of the holes has a shorter distance to the glass fibers GC than those of other surfaces.

Moreover, the portion where the thickness of the resin RES is thin tends to be easily damaged by a pressure of the gas (water vapor) generated when the moisture captured inside the glass fibers GC is vaporized in the above-described reflow process. That is, the large number of holes formed in the upper surface FLt of the frame member FLPh are considered to be a cause that makes the water vapor infiltrate easily into the bonding interface between the frame member FLPh and the bonding material.

Therefore, based on the above-described study results, the inventor of the present application has found a configuration in which the portion where the thickness of the resin RES becomes locally thin between the upper surface FLt and the glass fibers GC can be reduced by flattening the upper surface FLt of the frame member FLP as shown in FIG. 6. In the case of the present embodiment, the upper surface FLt of the frame member FLP is as flat as the upper surface SR1t of the insulating film SR1 shown in FIG. 4, or is flatter than the upper surface SR1t. In other words, the flatness of the upper surface FLt of the frame member FLP is as much as the flatness of the upper surface SR1t of the insulating film SR1, or is higher than that of the upper surface SR1t. In still the other words, the roughness of the upper surface FLt of the frame member FLP is as much as or less than the roughness of the upper surface SR1t of the insulating film SR1.

As a value of the surface roughness, a value of a ten-point average roughness Rz defined by the Japanese Industrial Standards (JIS B 0601-1994) has been used as an evaluation index. That is, the roughness Rz is set such that a value is expressed in terms of micrometers (µm), the value being obtained by sampling only a standard length from a roughness curve in a direction of an average line of the roughness curve, and by determining a sum of an average value among absolute values of altitudes of the highest to the fifth highest peak points and an average value among absolute values of altitudes of the lowest to the fifth lowest valley points, the altitudes being measured from the average line of the sampled section in a direction of vertical magnification. In the present first embodiment, note that each of the highest peak point and the lowest valley point is specified within, for example, a range of 50 µm square. However, the present invention is not limited to this range.

A roughness Rz of the upper surface FLt of the frame member FLPh shown in FIG. 5 is about 7 to 8 µm. Moreover, a roughness Rz of a part of the upper surface SR1t of the insulating film SR1 shown in FIG. 4, the part not covering the conductor pattern formed on the upper surface BSPt of the base member BSP, is about 3.1 to 4.9 µm. On the other hand, the roughness Rz of the upper surface FLt of the frame member FLP shown in FIG. 6 is set to about 2.7 to 3.3 µm, and more preferably, about 1.0 to 1.5 µm.

Figure 10:
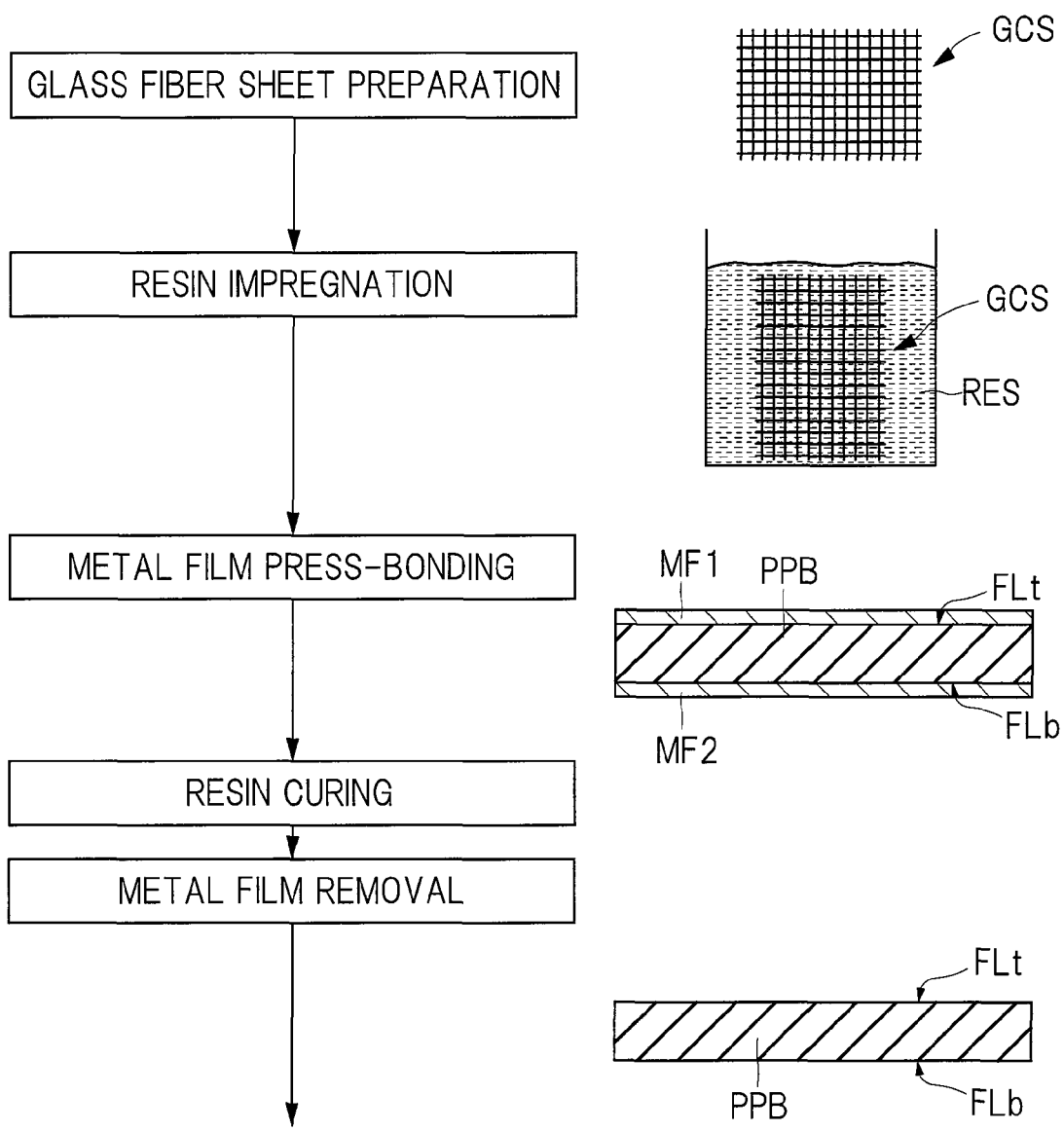
FIG. 10 is an explanatory view showing one example of a detailed flow of a frame-member assembly process shown in FIG. 7.

If the upper surface FLt of the frame member FLP is flat as shown in FIG. 6, there are few portions where the distance between the upper surface FLt and the glass fibers GC is locally shortened. In the reflow process, this case can suppress concentration of the pressure that is caused by the local application of the pressure of the moisture (water vapor) vaporized from the glass fibers CG onto the resin RES forming the frame member FLP. That is, the resin RES is difficult to be damaged because of the flat upper surface FLt of the frame member FLP, and therefore, the water vapor is difficult to reach the upper surface FLt of the frame member FLP. As a result, it is possible to suppress the water vapor from infiltrating into the bonding interface between the frame member FLP and the bonding material BND2 shown in FIG. 4, and therefore, the peeling off between the frame member FLP and the bonding material BND2 can be suppressed. Moreover, when the upper surface FLt is flattened by polishing the upper surface FLt as shown in FIG. 5, the distance between the glass fibers GC and the upper surface FLt becomes short on average. However, in the present embodiment, as shown in FIG. 10 to be described later, the upper surface FLt of the frame member FLP is flattened as shown in FIG. 6 by removing a metal film MF1 after the metal film MF1 whose press-bonding surface is flattened has been press-bonded onto a resin member PPB. For this reason, the distance between the glass fibers GC and the upper surface FLt becomes large on average. For example, in an example shown in FIG. 6, the shortest distance from an upper end of the glass fibers GC to the upper surface FLt is about as large as a diameter of the glass fiber GC, and is at least larger than a radius of the glass fiber GC. This case can further suppress the damage of the resin RES than in the case in which the upper surface FLt is flattened by the polishing as shown in FIG. 5.

According to the studies by the inventor of the present application, the higher the flatness of the upper surface FLt is, the easier the suppression of the above-described peeling is. For example, when the roughness Rz of the upper surface FLt was about 1.0 to 1.5 µm as described above, the above-described peeling was hardly confirmed in the evaluation based on the reflow heat resistant test. The roughness Rz of the rear surface CPb of the semiconductor chip CP shown in FIG. 3 was about 1.5 µm. Therefore, when the roughness Rz of the upper surface FLt (see FIG. 4) was about 1.0 to 1.5 µm, a value of the roughness Rz of the upper surface FLt is equal to or smaller than a value of the roughness of the rear surface CPb of the semiconductor chip CP. In other words, the roughness of the upper surface FLt of the frame member FLP is equal to or less than the roughness of the rear surface CPb of the semiconductor chip CP.

Moreover, as shown in FIG. 6, on the outer side surface FLs1 of the frame member FLP, a part of the glass fibers GC is exposed from the resin RES. In this case, the frame member FLP is easier to absorb moisture than that in the case in which no glass fibers GC are exposed. However, according to the present embodiment, the water vapor is suppressed from reaching the upper surface FLt by flattening the upper surface FLt of the frame member FLP, and therefore, the peeling of the bonding material BND2 can be suppressed.

Note that the explanation has been made about the fact that no glass fibers are contained in the insulating film SR1 and the insulating film SR2 of the semiconductor device PKG1. However, as shown in FIG. 4, a plurality of filler particles SLF are contained therein. Moreover, as shown in FIG. 4, not only the glass fibers GC and the resin RES but also the plurality of filler particles SLF are contained in the frame member FLP. However, as a modified example, no filler particles SLF are contained in the insulating film SR1, the insulating film SR2 and the frame member FLP in some cases.

The filler particles SLF are particles for use in adjusting the characteristics (for example, characteristics such as a linear expansion coefficient) of the insulating film SR1 and the insulating film SR2 (or the frame member FLP), which are comprised of an inorganic material such as, for example, silica (substance comprised of silicon dioxide) or others. When the filler particles SLF are contained in the insulating film SR1, the filler particles SLF absorb moisture. When the moisture absorbed by the filler particles SLF is vaporized by heating, the water vapor moves to an upper part of the insulating film SR1, and is discharged from the upper surface SR1t of the insulating film SR1. However, when it is studied whether the peeling is caused by the infiltration of the water vapor into the bonding interface between the bonding material BND1 and the insulating film SR, the amount of the moisture absorbed by the filler particles SLF (hereinafter, referred to as "moisture absorption amount") is extremely smaller than the moisture absorption amount of the glass fibers GC, and is substantially vanishingly small. For this reason, even if a large amount of filler particles SLF are contained in the insulating film SR1, it is considered that the peeling due to the moisture absorption of the filler particles SLF is not caused.

<Method of Manufacturing Semiconductor Device>

Figure 7:
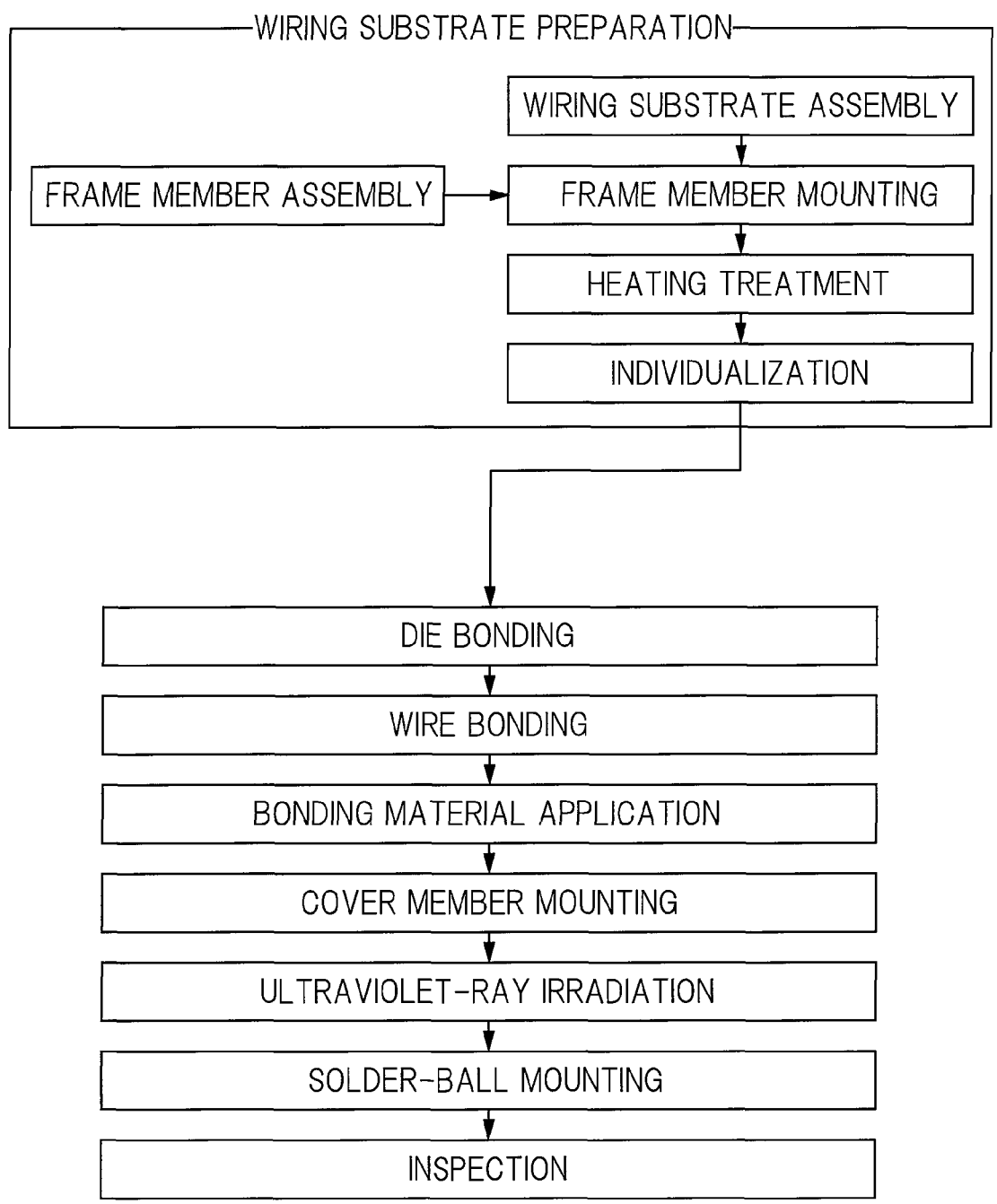
FIG. 7 is an explanatory view showing an assembly flow of the semiconductor device shown in FIG. 1 to FIG. 4.

Next, a method of manufacturing the semiconductor device PKG1 shown in FIG. 1 to FIG. 4 will be explained. FIG. 7 is an explanatory view showing an assembly flow of the semiconductor device shown in FIG. 1 to FIG. 4. In the present embodiment, explanation will be made by exemplifying a mode in which a wiring substrate on which a frame member is mounted is purchased and a semiconductor chip or others is mounted and assembled on the wiring substrate. For this reason, as shown in FIG. 7, the frame member mounting process or others is included in a wiring substrate preparation process. However, a part or the entire of the respective processes included in the wiring substrate preparation process may be collectively performed at one factory. For example, each of the frame member assembly process, the frame member mounting process, the heating treatment process and the dicing process shown in FIG. 7 may be not included in the wiring substrate preparation process, and each of the processes may be a different process from the wiring substrate preparation process.

<Wiring Substrate Preparation Process>

Figure 8:
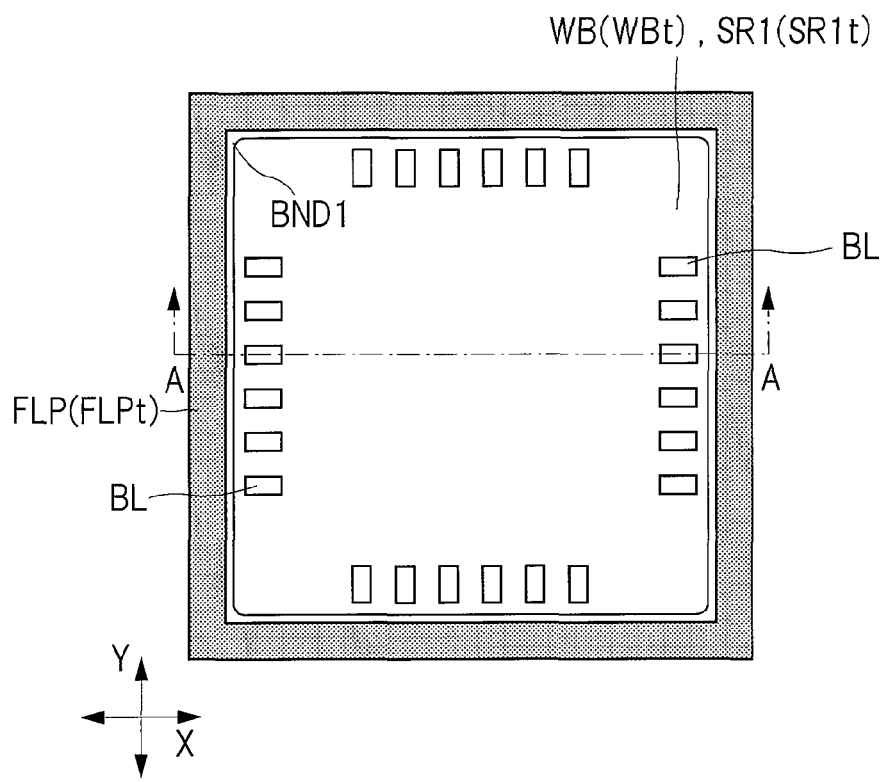
FIG. 8 is a plan view of a wiring substrate to be prepared in a wiring substrate preparation process shown in FIG. 7.
Figure 9:
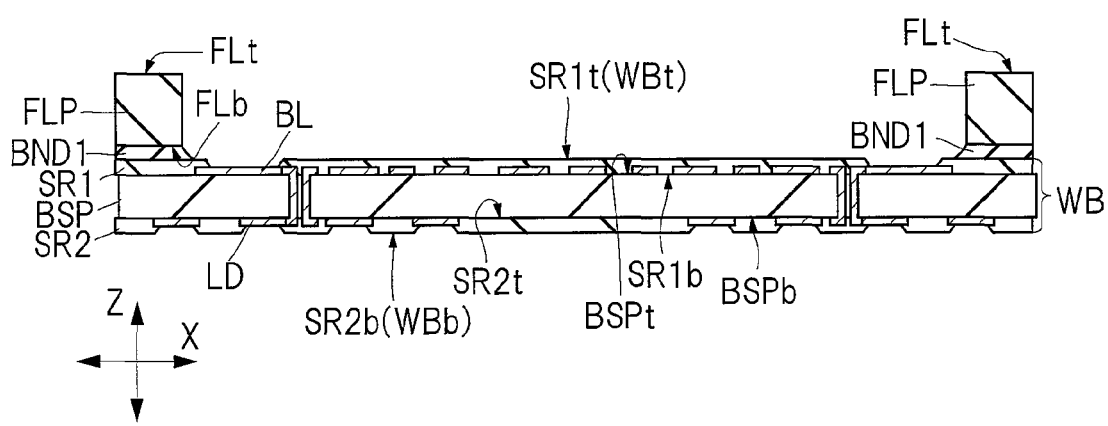
FIG. 9 is a cross-sectional view taken along a line A-A of FIG. 8.

As shown in FIG. 8 and FIG. 9, in the wiring substrate preparation process shown in FIG. 7, the wiring substrate WB having the frame member FLP mounted on the upper surface WBt is prepared. FIG. 8 is a plan view of the wiring substrate prepared in the wiring substrate preparation process shown in FIG. 7. FIG. 9 is a cross-sectional view taken along a line A-A of FIG. 8.

As shown in FIG. 9, the wiring substrate WB to be prepared in the present process has a base member BSP, a terminal BL formed on the upper surface BSPt of the base member BSP, an insulating film SR1 formed on the upper surface BSPt such that the terminal BL is exposed, and an insulating film SR2 formed on the lower surface BSPb such that the terminal LD is exposed. On the wiring substrate WB to be prepared in the present process, the semiconductor chip CP shown in FIG. 3 is not mounted. Moreover, to the plurality of terminals BL, wires BW shown in FIG. 3 are not connected. Furthermore, a solder ball SB shown in FIG. 3 is not connected to each of the plurality of terminals LD. A structure of the wiring substrate WB to be prepared in the present process is the same as a structure of the wiring substrate WB shown in FIG. 1 to FIG. 3 except for the above-described differences. Therefore, repetitive explanations will be omitted.

Moreover, onto the upper surface SR1t of the insulating film SR1, the frame member FLP is bonded and fixed via the bonding material BND1. As explained with reference to FIG. 4, the frame member FLP is a member comprised of the glass fibers GC and the resin RES with which the glass fibers GC are impregnated, and is bonded and fixed onto the wiring substrate WB while the lower surface FLb faces to the upper surface SR1t of the insulating film SR1 of the wiring substrate WB.

The bonding material BND1 is a material that is formed by curing an adhesive containing a thermosetting resin as its main component. In the present embodiment, the bonding material BND1 is a bonding tape obtained by forming an adhesive layer containing a thermosetting resin as a main component on both surfaces of a resin film serving as a base member. When the bonding tape is used, the bonding material BND1 (see FIG. 9) can be previously adhered on the lower surface FLb (see FIG. 9) of the frame member FLP (see FIG. 9) in the frame member assembly process shown in FIG. 7. Moreover, when the bonding tape is used, the amount of the bonding material BND1 that spreads on the periphery of the frame member FLP can be smaller than that of a paste bonding material. For this reason, this bonding material is effective when the distance from the region on which the frame member FLP is mounted to the terminal BL is short. As a modified example of the present embodiment, a paste bonding material which contains a thermosetting resin as a main component and which is in a paste state before being cured may be used as the bonding material BND1. In the case of the paste bonding material, a part of the bonding material also adheres to the inner side surface FLs2 (see FIG. 4) of the frame member FLP. Thus, an area of the bonding between the bonding material BND1 and the frame member FLP increases, and therefore, the bonding strength of the frame member FLP can be improved.

In the frame member mounting process, the frame member FLP having the bonding material BND1 adhered on the lower surface FLb is arranged on the wiring substrate WB (see FIG. 9), and the bonding material BND1 and the upper surface SR1t of the insulating film SR1 are bonded to each other. Then, a heating treatment (cure baking) for curing the thermosetting resin component of the bonding material BND1 shown in FIG. 9 is performed (heating treatment process). When the thermosetting resin component contained in the bonding material BND1 is cured, the frame member FLP is bonded and fixed onto the wiring substrate WB.

When the glass fibers GC (see FIG. 6) contained in the frame member FLP have absorbed the moisture prior to the heating treatment process, the moisture is vaporized during the heating treatment process in some cases. At this time, when the upper surface FLt is rough as similar to the frame member FLPh explained with reference to FIG. 5, a part of the resin RES is damaged by the pressure of the water vapor to form a passage that communicates from the upper surface FLt to the glass fibers GC in some cases. When the passage that communicates with the upper surface FLt is formed in the present process, the passage becomes a cause of movement of the water vapor to the upper surface FLt every time the moisture absorbed by the glass fibers GC is vaporized.

Therefore, when the upper surface FLt that is rough as similar to the frame member FLPh shown in FIG. 5 is used, it is required to use a method of, for example, heating while peripherally releasing the pressure of the water vapor by making a temperature-rising rate slow in order to suppress the damage in a part of the resin RES.

On the other hand, in the case of the frame member FLP of the present embodiment shown in FIG. 6, the upper surface FLt is flattened such that the value of the roughness Rz of the upper surface FLt is about equal to or smaller than the value of the roughness Rz of the upper surface SR1t (see FIG. 9) of the insulating film SR1 (see FIG. 9). Therefore, even if the moisture is vaporized from the glass fibers GC in the heating treatment process, the resin RES is difficult to be damaged. Thus, such a particular process as to make the temperature-rising rate slow as described above is unnecessary. As a result, the heating treatment process can be efficiently performed.

Figure 11:
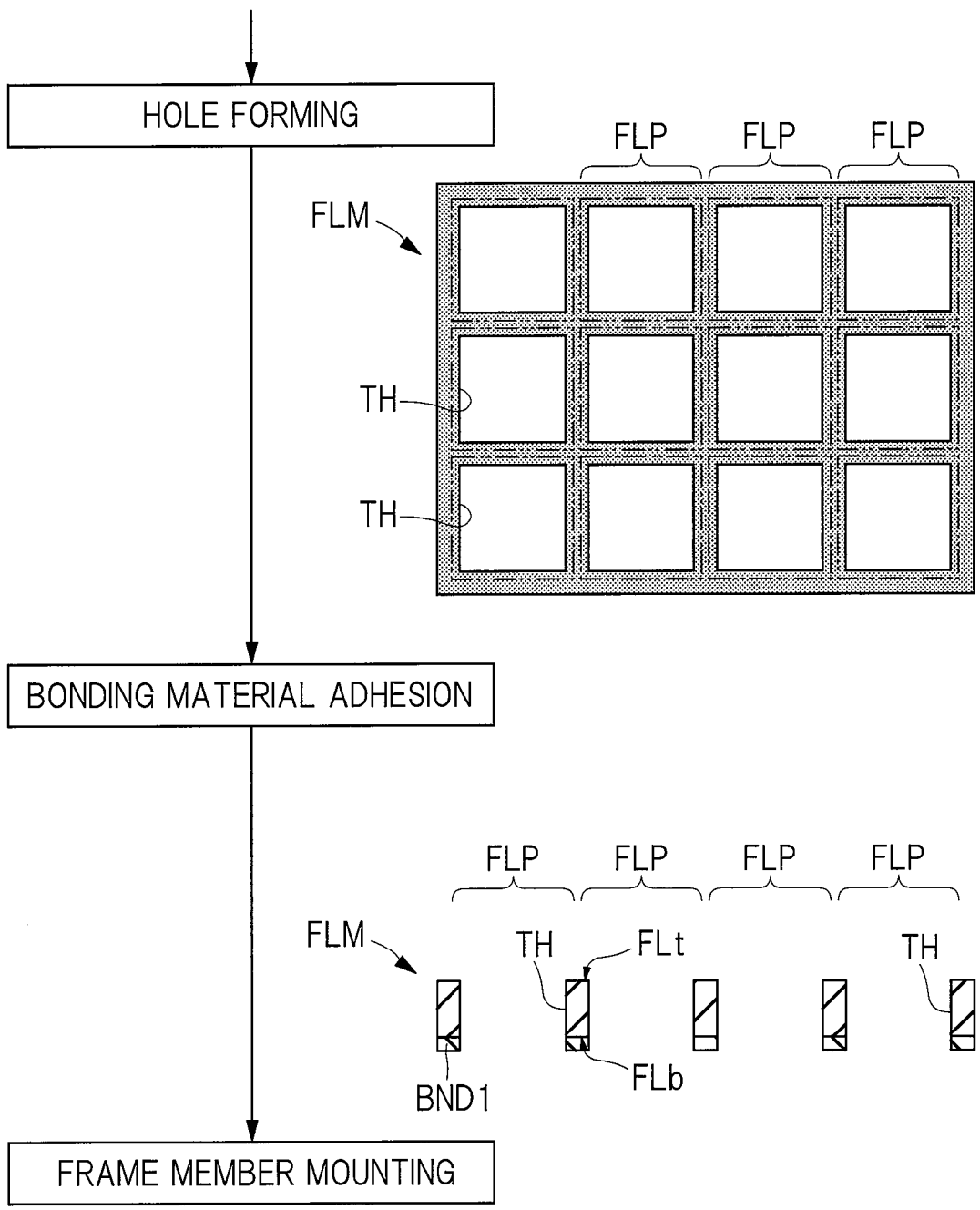
FIG. 11 is an explanatory view showing one example of a detailed flow of the frame-member assembly process, continued from FIG. 10.

Incidentally, for example, the frame member FLP as shown in FIG. 8 and FIG. 9 is assembled as follows. FIG. 10 and FIG. 11 are explanatory views each showing one example of a detailed flow of the frame member assembly process shown in FIG. 7. In FIG. 10 and FIG. 11, explanatory diagrams for schematically showing the outline of each of processes are made to be close to each of the processes included in the frame member assembly process.

In the frame member assembly process, first, a glass fiber sheet GCS obtained by forming glass fibers into a sheet shape is prepared (glass fiber sheet preparation process). Then, the glass fiber sheet GCS is immersed in the resin RES such that the glass fiber sheet GCS is impregnated with the resin RES (resin impregnating process).

Then, a part of the thermosetting resin component contained in the resin RES is cured, such that a resin member (prepreg member) PPB comprised of the glass fiber sheet GCS and the half-cured resin RES is formed. Note that the above-described half-cured state represents a state in which a part of the thermosetting resin component is cured but not completely cured, and this state is not limited to a state in which 50% of the thermosetting resin component is cured.

Then, the half-cured resin member PPB is sandwiched by a metal film MF1 and a metal film MF2, and the metal film MF1 and the metal film MF2 are press-bonded onto the resin member PPB (metal film press-bonding process). Each of the metal film MF1 and the metal film MF2 is, for example, a copper foil. At this time, by adjusting the roughness Rz of the press-bonding surface of the metal film MF1, the roughness Rz of the upper surface FLt of the frame member FLP shown in FIG. 6 can be controlled. For example, when the roughness Rz of the press-bonding surface of the metal film MF1 is large, a frame member having the large roughness Rz of the upper surface FLt as similar to the frame member FLPh shown in FIG. 5 is obtained. When the metal film MF1 whose press-bonding surface has been subjected to a surface roughening treatment is used, if the metal film MF1 is press-bonded onto the resin member PPB, a protrusion protruding from a surface of the metal film MF1 digs into the resin member PPB. As a result, the portion where the distance from the upper surface FLt of the frame member FLPh to the glass fiber GC is short, that is, where the resin RES is thin, is formed. On the other hand, when the press-bonding surface of the metal film MF1 is flattened, the protrusion amount of the protrusion from the surface of the metal film MF1 is small. Therefore, even if such a metal film MF1 is press-bonded to the resin member PPB, a frame member FLP whose roughness Rz of the upper surface FLt is not high as shown in FIG. 6, that is, the frame member FLP whose distance from the upper surface FLt to the glass fibers GC is long, in other words, the frame member FLP where the resin RES is thick, can be obtained.

Similarly, by adjusting the roughness Rz of the press-bonding surface of the metal film MF2, the roughness Rz of the lower surface FLb of the frame member FLP shown in FIG. 4 can be controlled. In the present embodiment, the roughness Rz of the press-bonding surface of the metal film MF1 and the roughness Rz of the press-bonding surface of the metal film MF2 are almost equal to each other. For this reason, the roughness Rz of the upper surface FLt and the roughness Rz of the lower surface FLb of the frame member FLP shown in FIG. 4 are almost equal to each other. Therefore, the roughness Rz of the lower surface FLb of the frame member FLP shown in FIG. 4 is not so higher than the roughness Rz of the upper surface SR1t of the insulating film SR1. Moreover, the roughness Rz of the lower surface FLb of the frame member FLP is not so higher than the roughness Rz of the lower surface SR2b of the insulating film SR2. Particularly, the roughness Rz of the lower surface FLb of the frame member FLP is preferably not so higher than the roughness Rz of the rear surface CPb of the semiconductor chip CP shown in FIG. 3.

Thereafter, a heating treatment (cure baking) is performed on the resin member PPB while the metal film MF1 and the metal film MF2 are press-bonded thereto, such that the thermosetting resin component contained in the resin member PPB is cured (resin curing process). In the present process, it is preferable to make the temperature-rising rate slow in order to suppress damage on a part of the resin RES (see FIG. 6) before being cured due to the gas (vaporized moisture, water vapor) generated from the glass fibers.

Thereafter, each of the metal film MF1 and the metal film MF2 is removed such that the upper surface FLt and the lower surface FLb of the frame member FLP shown in FIG. 4 are exposed (metal film removing process). The metal film MF1 and the metal film MF2 can be removed by, for example, etching. When the metal film MF1 is selectively removed by the etching, the upper surface FLt having the roughness Rz explained with reference to FIG. 6 is exposed. Similarly, when the metal film MF2 is selectively removed by the etching, the lower surface FLb having the roughness Rz that is almost equal to that of the upper surface FLt is exposed.

Thereafter, the through hole TH is formed in the resin member PPB from which the metal films MF1 and MF2 have been removed, and is molded into a frame shape (hole forming process). In an example shown in FIG. 11, an example mode in which a plurality of frame members are collectively manufactured is shown. Therefore, the number of (twelve in FIG. 11) through holes TH as shown in FIG. 11 corresponds to the number of frame members to be collectively assembled.

Moreover, when a bonding tape is utilized as the bonding material BND1 (see FIG. 9) as described above, the bonding material BND1 is adhered (bonding material adhering process) after the hole forming process. When a through hole is also formed in the bonding tape together with the resin member PPB in the hole forming process, the bonding material adhering process may be performed after the metal film removing process and before the hole forming process. Moreover, when the paste bonding material is used as the bonding material BND1, the bonding material adhering process can be omitted. In this case, before the frame member mounting process shown in FIG. 7, a bonding material applying process (illustration is omitted) for applying the paste bonding material is performed on at least either the wiring substrate or the frame member.

Figure 12:
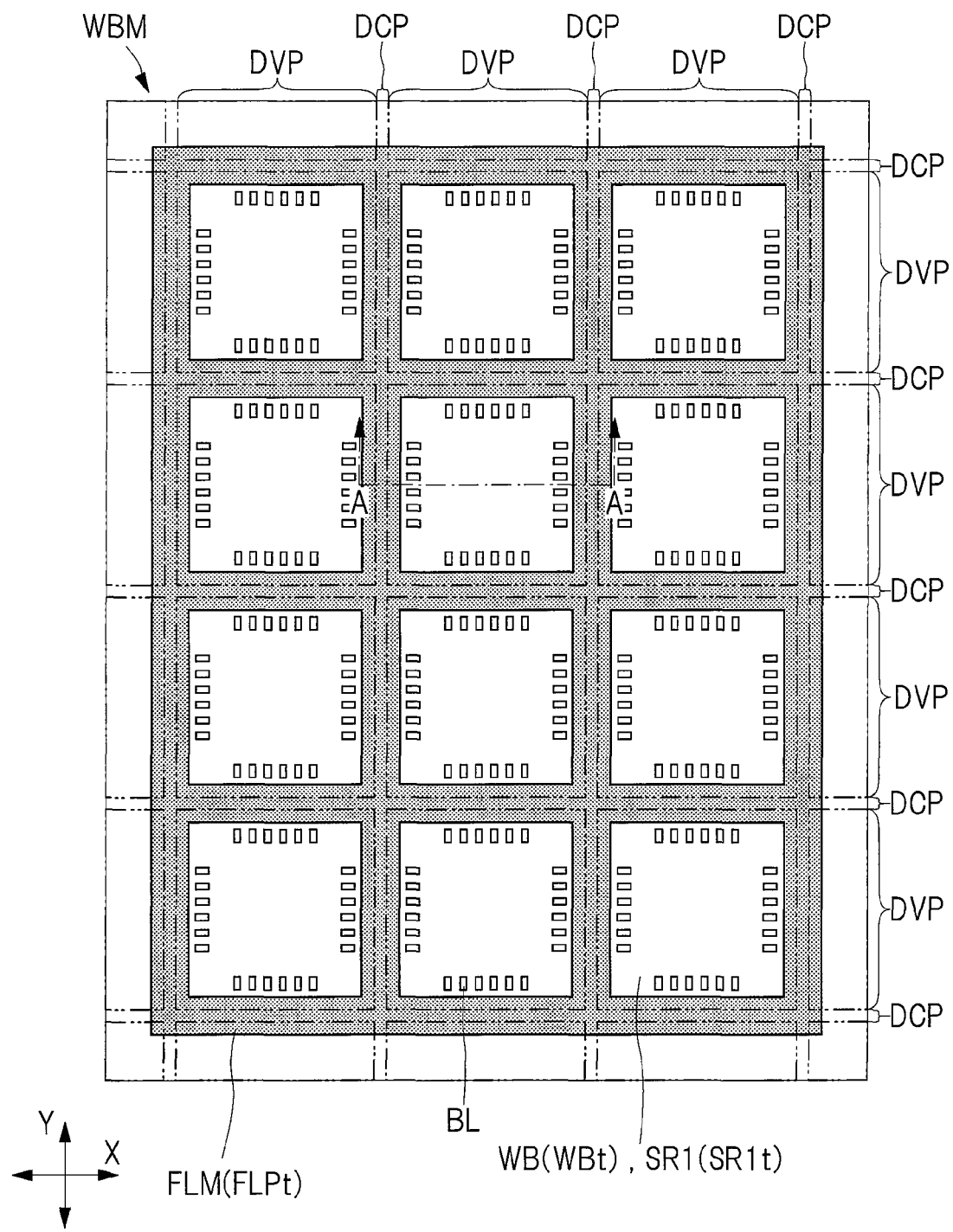
FIG. 12 is a plan view showing a state in which the frame member is mounted on the wiring substrate in a frame-member mounting process shown in FIG. 7.

When the plurality of frame members FLP are collectively assembled as shown in FIG. 11, a frame member FLM obtained by collectively assembling the plurality of frame members as shown in FIG. 12 is mounted on a wiring substrate WBM from which multiple pieces are chipped in the frame member mounting process shown in FIG. 7. FIG. 12 is a plan view showing a state in which the frame members are mounted on the wiring substrate in the frame member mounting process shown in FIG. 7. The wiring substrate WBM from which multiple pieces are chipped is a wiring substrate on which portions corresponding to a plurality of wiring substrates WB (see FIG. 9) (device regions DVP shown in FIG. 12) are integrally formed. When the wiring substrate WBM from which multiple pieces are chipped is utilized, the manufacturing efficiency is improved since the plurality of wiring substrates WB can be collectively manufactured.

Moreover, in an example shown in FIG. 7, after the heating treatment process, the wiring substrate WBM and the frame member FLM shown in FIG. 12 are cut along extending directions of cutting regions (cutting lines, dicing lines) DCP such that they are divided for each wiring substrate WB as shown in FIG. 8 and FIG. 9 (individualization process). As the cutting method, for example, a cutting process using a rotary blade called a "dicing blade" or others can be used. In the example shown in FIG. 7, note that the individualization process is included in the wiring substrate preparation process. However, the individualization process may be performed after the solder ball mounting process. In this case, in the state of the individualization wiring substrate WBM (see FIG. 12), each process from the wiring substrate preparation process to the solder ball mounting process shown in FIG. 7 is performed.

<Die Bonding>

Figure 13:
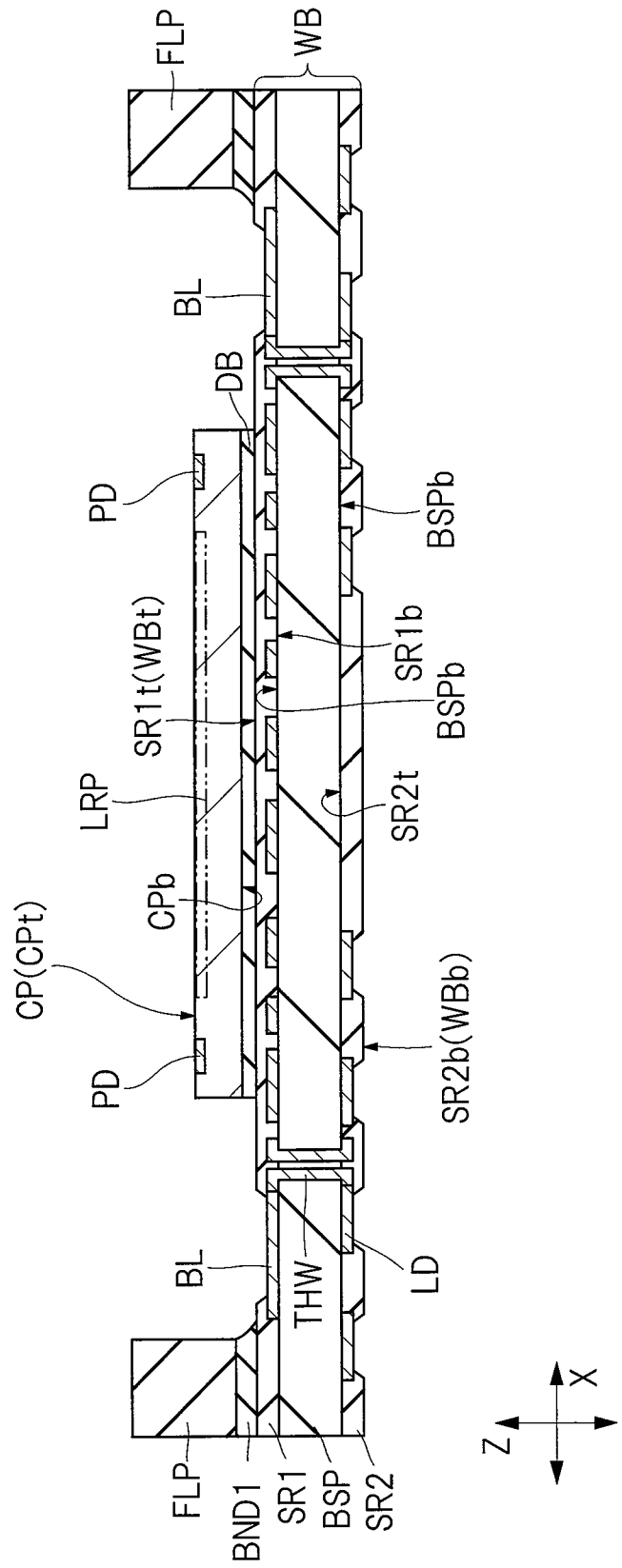
FIG. 13 is a cross-sectional view showing a state in which a semiconductor chip is mounted on the wiring substrate shown in FIG. 9.

Next, in a die bonding process shown in FIG. 7, a semiconductor chip CP is mounted on the upper surface WBt of the wiring substrate WB as shown in FIG. 13. FIG.

13 is a cross-sectional view showing a state in which the semiconductor chip is mounted on the wiring substrate shown in FIG. 9.

In the present embodiment, the semiconductor chip CP is mounted (fixed) via the bonding material (die bonding material) DB on the upper surface SR1t of the insulating film SR1 of the wiring substrate WB such that the rear surface CPb faces to the upper surface SR1t of the insulating film SR1 of the wiring substrate WB. Moreover, the semiconductor chip CP is mounted on the upper surface SR1t in a region (chip mounting region) surrounded by the frame member FLP. Since the structure of the semiconductor chip CP has been already explained, the overlapped explanations will be omitted.

As similar to the bonding material BND1, the bonding material DB is a bonding material containing a thermosetting resin as its main component. In an example shown in FIG. 13, the bonding material DB is a bonding tape obtained by forming an adhesive layer containing a thermosetting resin as a main component on both surfaces of a resin film forming a base member. Moreover, as a modified example, a paste bonding material containing a thermosetting resin as a main component may be used as the bonding material DB. When the bonding tape is used, the mounting is enabled while the bonding material DB is previously adhered to the rear surface CPb. Moreover, when the bonding tape is used, the amount of the bonding material DB that spreads on the periphery of the semiconductor chip CP can be smaller than that of the paste bonding material. For this reason, this material is effective when the distance from the chip mounting region to the terminal BL is short. On the other hand, in the case of the paste bonding material, a part of the bonding material also adheres on a side surface of the semiconductor chip CP. Thus, a bonding area between the bonding material DB and the semiconductor chip CP increases, and therefore, a bonding strength of the semiconductor chip CP can be improved.

In the present process, a heating process (cure baking) is performed after the semiconductor chip CP is adhered to the insulating film SR1 via the bonding material DB, such that the bonding material DB is cured. Thus, the semiconductor chip CP is bonded and fixed onto the wiring substrate WB.

Moreover, in the present process, it is preferable to prevent formation of a gap between the bonding material DB and the insulating film SR1. For this reason, the upper surface SR1t of the insulating film SR1 is preferably prepared as a flat surface. As described above, the roughness Rz of the upper surface SR1t of the insulating film SR1 is set to about 3.1 to 4.9 μm. If the roughness value is such a roughness value, the formation of the gap between the bonding material DB and the insulating film SR1 in the die bonding process can be prevented.

<Wire Bonding>

Figure 14:
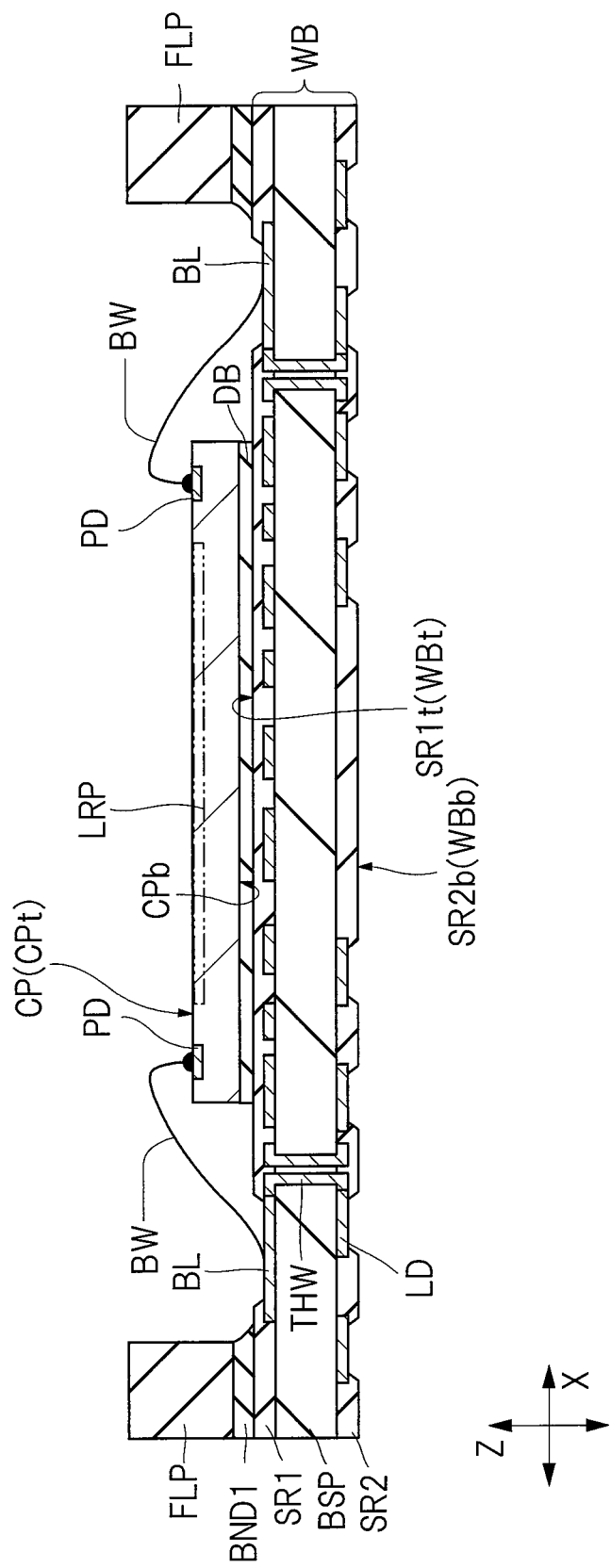
FIG. 14 is a cross-sectional view showing a state in which wires are connected to the semiconductor chip and the wiring substrate shown in FIG. 13.

Next, in a wire bonding process shown in FIG. 7, the pad PD of the semiconductor chip CP and the terminal BL of the wiring substrate WB are electrically connected to each other via the wire BW as shown in FIG. 14. FIG. 14 is a cross-sectional view showing a state in which wires are connected to the semiconductor chip and the wiring substrate shown in FIG. 13. In the present embodiment, the plurality of pads PD and the plurality of terminals BL are electrically connected to each other.

In the present process, a wire loop is formed, for example, after one end of the wire BW is connected to the pad PD of the semiconductor chip CP. Thereafter, the wire BW is connected to the terminal BL, and then, the wire is cut, such that the wire BW as shown in FIG. 14 is obtained.

<Bonding Material Applying Process>

Figure 15:
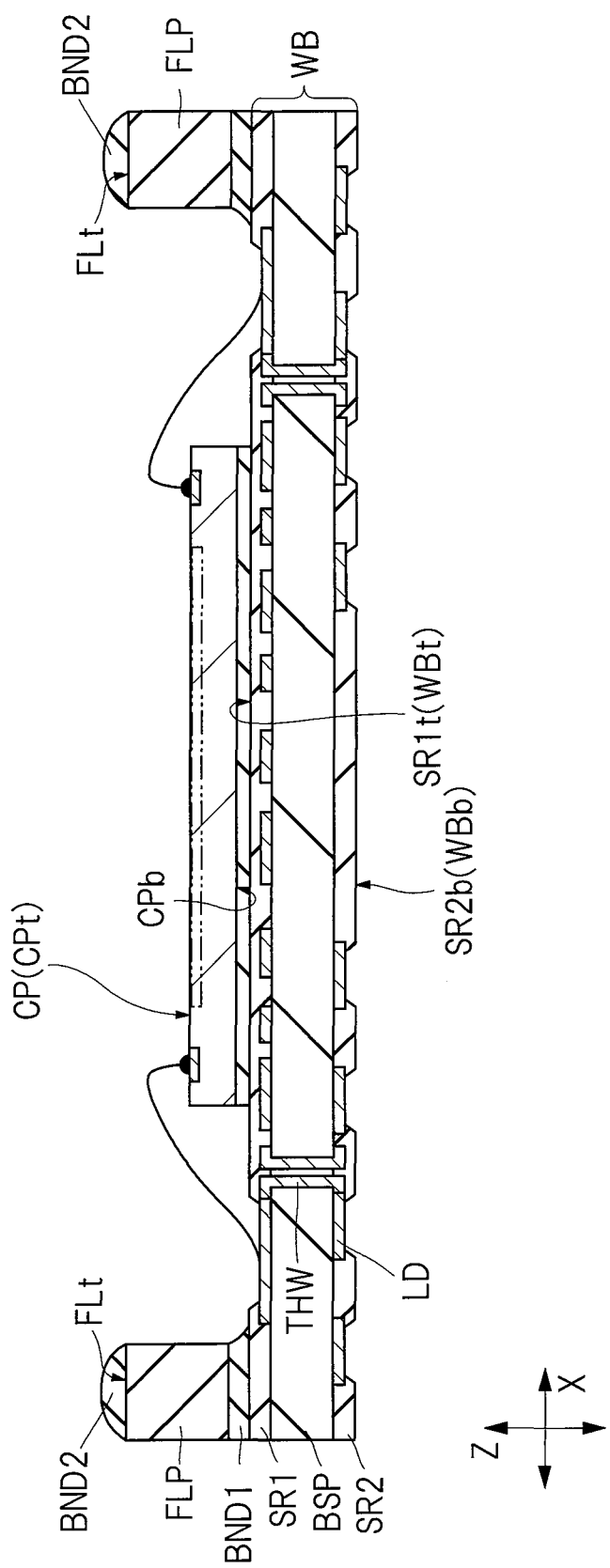
FIG. 15 is a cross-sectional view showing a state in which a bonding material is applied onto the frame member shown in FIG. 14.

Next, in a bonding material applying process shown in FIG. 7, a bonding material BND2 is disposed (applied) onto the upper surface FLt of the frame member FLP as shown in FIG. 15. FIG. 15 is a cross-sectional view showing a state in which the bonding material is applied onto the frame member shown in FIG. 14.

As described above, the bonding material BND2 is a bonding material containing an ultraviolet-ray curable resin as a main component that is cured by being irradiated with an ultraviolet ray. Moreover, in the present embodiment, the bonding material BND2 is in a paste state before being cured. For this reason, in the present embodiment, the bonding material BND2 can be applied onto the upper surface FLt of the frame member FLP as shown in FIG. 15.

As a modified example of the present embodiment, note that the thermosetting resin can be contained as a main component of the bonding material BND2. However, in the heating treatment (cure baking) for curing the thermosetting resin, it is required to leave the material under a predetermined environmental condition (temperature: 150° C., time: two hours or longer). For this reason, when the heating process is performed while the semiconductor chip CP is tightly sealed as shown in FIG. 3, a heat load on the semiconductor chip CP becomes large. On the other hand, in the case of the ultraviolet-ray curable resin, the bonding material BND2 can be cured when being irradiated with ultraviolet ray, and therefore, the load on the semiconductor chip CP becomes small. Note that the above-described environmental condition includes various conditions depending on a material to be used.

<Cover Member Mounting>

Figure 16:
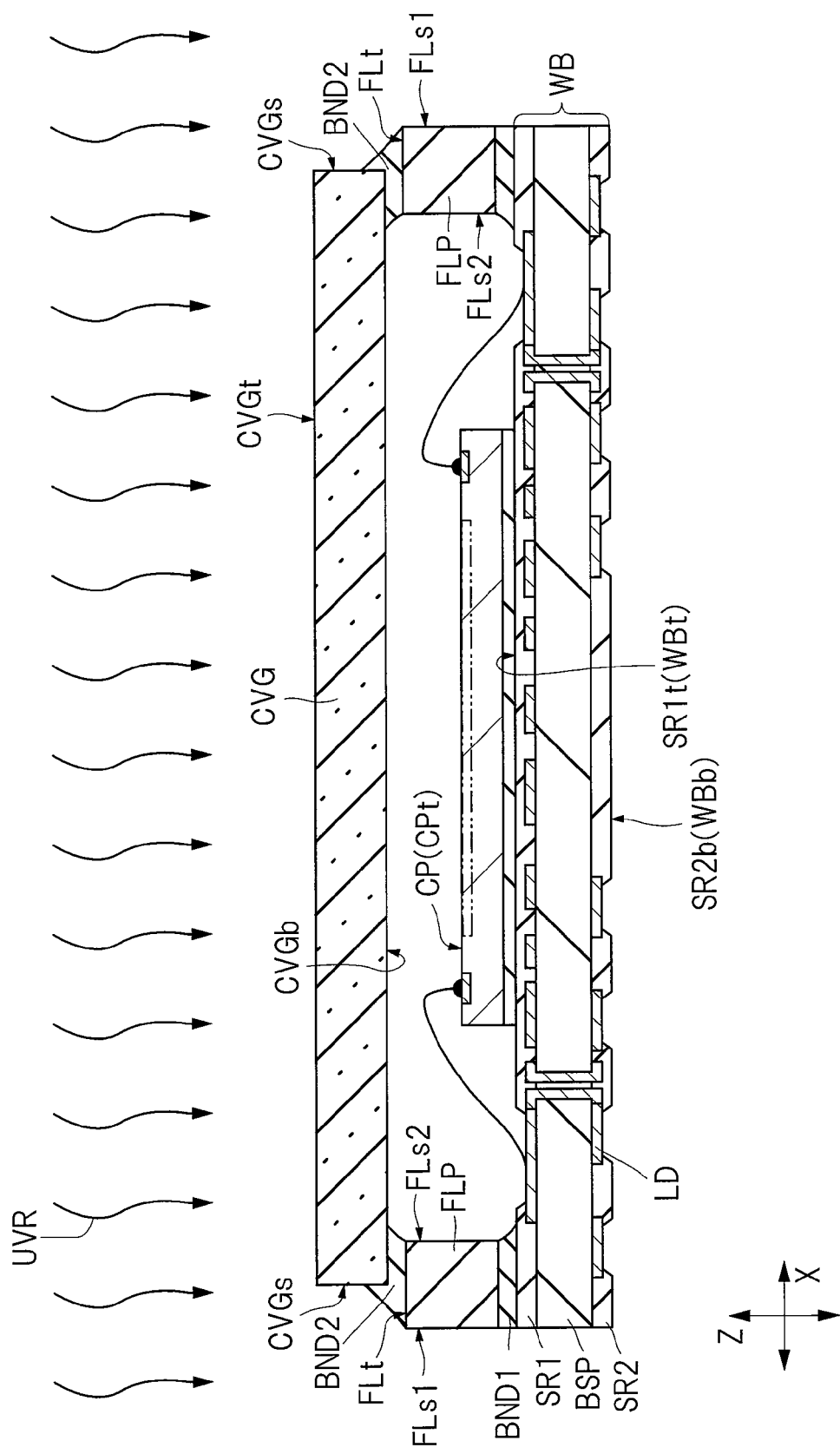
FIG. 16 is a cross-sectional view showing a state in which a cover member is mounted on the frame member shown in FIG. 15, and is then irradiated with ultraviolet ray.

Next, in the cover member mounting process shown in FIG. 7, a cover member CVG is mounted (fixed) on the upper surface FLt of the frame member FLP via the bonding material BND2 as shown in FIG. 16. FIG. 16 is a cross-sectional view showing a state in which the cover member is mounted on the frame member shown in FIG. 15 and is irradiated with an ultraviolet ray. In FIG. 16, the ultraviolet ray UVR is schematically shown.

In the present process, the lower surface CVGb side of the cover member CVG is pressed onto the bonding material BND2 such that the lower surface CVGb of the cover member CVG faces to the upper surface SR1t of the insulating film SR1 of the wiring substrate WB and the front surface CPt of the semiconductor chip CP. Thus, the paste bonding material BND2 is deformed and spreads along the shape of the cover member CVG.

In the present embodiment, a plane size of the cover member CVG becomes smaller than a plane size of the wiring substrate WB and a plane size of the frame member. For this reason, each area of the upper surface CVGt and the lower surface CVGb of the cover member CVG is smaller than an area of the upper surface WBt of the wiring substrate WB (area of the upper surface SR1t of the insulating film SR1). Moreover, a total value of the lengths of sides forming each outer edge of the upper surface CVGt and the lower surface CVGb of the cover member CVG is shorter than a total value of the lengths of the sides of the upper end of the outer side surface FLs1 of the frame member FLP.

In other words, the cover member CVG has a side surface CVGs located between the upper surface CVGt and the lower surface CVGb in its thickness direction (Z-direction), and the side surface CVGs is located between the outer side surface FLs1 and the inner side surface FLs2 when seen in a cross-sectional view in the thickness direction of the cover member CVG. More specifically, all the side surfaces CVGs of the cover member CVG are located between the outer side surface FLs1 and the inner side surface FLs2 when seen in a plan view.

When the plane size of the cover member CVG is smaller than the plane size of the frame member FLP as described above, even if the mounting position of the cover member CVG slightly shifts in the present process, the cover member CVG can be suppressed from being mounted such that it protrudes outward from the frame member FLP. Moreover, when the plane size of the cover member CVG is smaller than the plane size of the frame member FLP, the bonding material BND2 adheres to a part of the side surfaces CVGs of the cover member CVG as shown in FIG. 16. Thus, the bonding strength between the frame member FLP and the cover member CVG can be improved by the bonding material BND2.

<Ultraviolet-Ray Irradiation>

Next, in an ultraviolet-ray irradiation process shown in FIG. 7, the bonding material BND2 is irradiated with an ultraviolet ray UVR as shown in FIG. 16 to cure the bonding material BND2. The cover member CVG is comprised of a visible light transmissive material as described above. Therefore, in the present process, when, for example, an ultraviolet ray UVR is irradiated from the cover member CVG side as shown in FIG. 16, the frame member FLP can be irradiated with the ultraviolet ray via the cover member CVG.

Here, according to the study results made by the inventor of the present application, it has been found that the moisture is vaporized from the glass fibers GC shown in FIG. 6 in this ultraviolet-ray irradiation process. When the moisture is vaporized by the heating treatment, a vaporization speed can be controlled by making the temperature-rising rate slow. Therefore, for example, even when the frame member FLPh shown in FIG. 5 is utilized, the damage on the resin RES can be suppressed. However, when the moisture is vaporized from the glass fibers GC by the ultraviolet ray, it is difficult to control the vaporization amount even by controlling the irradiation amount of the ultraviolet ray. Therefore, when the frame member FLPh shown in FIG. 5 contains the moisture, the resin RES tends to be damaged by the ultraviolet-ray irradiation.

On the other hand, in the case of the frame member FLP in the present embodiment shown in FIG. 6, the upper surface FLt is flattened such that the value of the roughness Rz thereof is equal to or smaller than the value of the roughness Rz of the upper surface SR1$t$ (see FIG. 9) of the insulating film SR1 (see FIG. 9), that is, the distance from the upper surface FLt of the frame member FLP to the glass fibers GC becomes longer than that of the frame member FLPh shown in FIG. 5. Therefore, in the ultraviolet-ray irradiation process, the damage on the resin RES can be suppressed even when the moisture contained in the glass fibers GC is vaporized such that the gas pressure increases. For this reason, in the ultraviolet-ray irradiation process, the infiltration of bubbles (bubbles caused by the water vapor) that becomes a cause of the peeling on the bonding interface between the bonding material BND2 and the frame member FLP can be suppressed.

When the bonding material BND2 is cured in the present process, the cover member CVG is bonded and fixed onto the frame member FLP via the bonding material BND2. Moreover, a space which is surrounded by the wiring substrate WB, the frame member FLP and the cover member CVG and on which the semiconductor chip CP is mounted is tightly sealed.

<Solder Ball Mounting>

Figure 17:
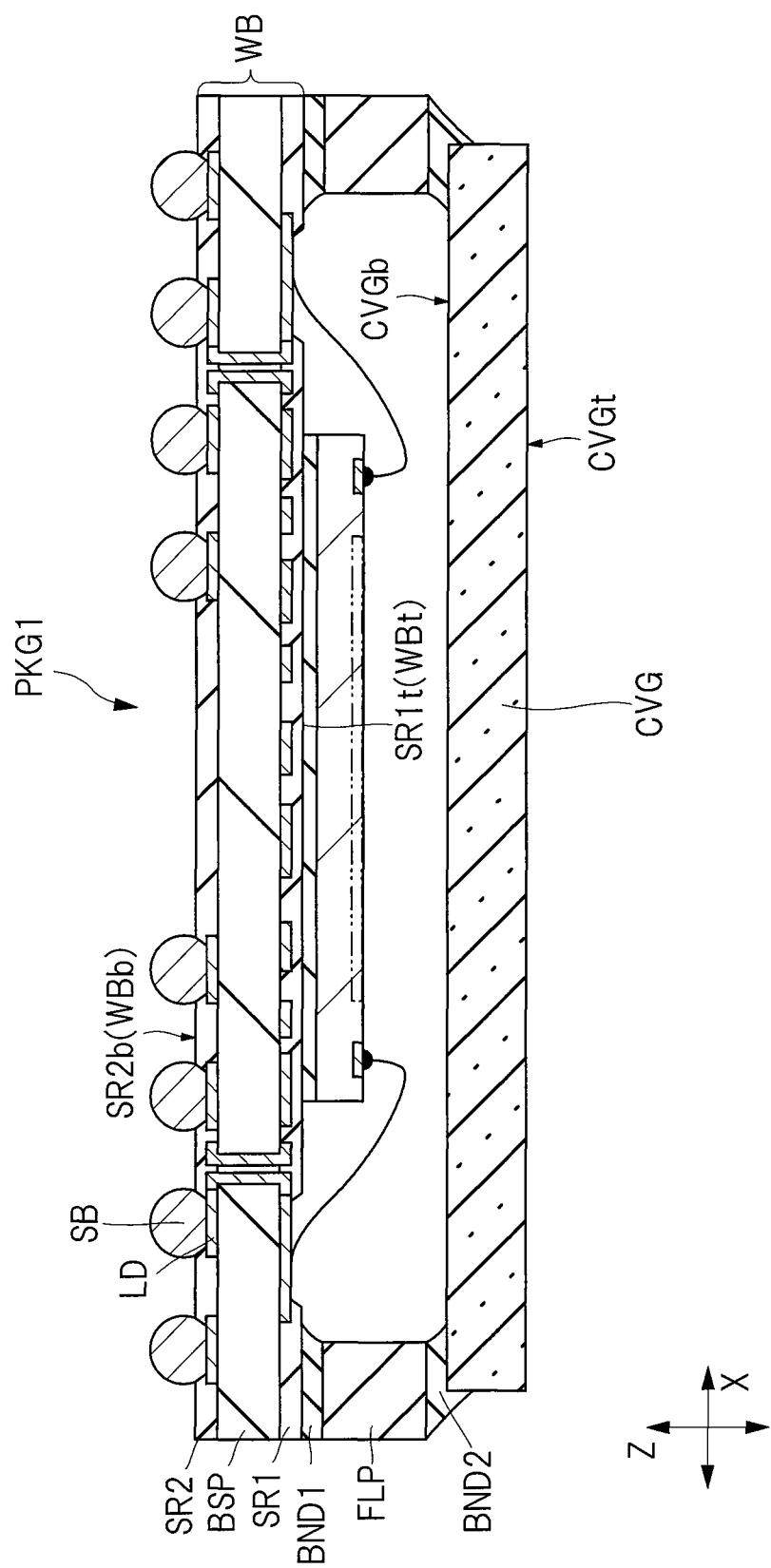
FIG. 17 is a cross-sectional view showing a state in which solder balls are joined to terminals shown in FIG. 16.

Next, in a solder ball mounting process shown in FIG. 7, a solder ball SB is joined to the terminal LD as shown in FIG. 17. FIG. 17 is a cross-sectional view showing a state in which the solder ball is joined to the terminal shown in FIG. 16.

As shown in FIG. 17, the present process is executed while the wiring substrate WB is turned upside down. That is, the solder ball mounting process is executed while the insulating film SR2 from which the plurality of terminals are exposed is at a position lower than the insulating film SR1. In the present process, as shown in FIG. 17, while the wiring substrate WB is turned upside down, a solder paste or a flux paste not shown is applied onto the exposed surfaces of the plurality of terminals LD. Note that the solder paste is a paste-state material containing a flux component for activating a surface of a solder material in addition to a solder component. Moreover, the flux paste is a paste-state material containing no solder component.

Next, the ball-shaped solder material, that is, the solder ball SB is disposed on the terminal LD. The solder balls are disposed on the plurality of terminals LD, respectively. Next, the solder balls SB are heated (reflowed) such that the solder component is fused such that the solder balls SB are joined to the terminals LD. At this time, the flux component contained in the solder paste or the flux paste activates the surfaces of the solder balls SB and the terminals LD to be brought in an easily joining state. Next, after the solder balls SB are cooled, a washing process for removing residues of the flux component or others is performed. Thus, the semiconductor device PKG1 shown in FIG. 3 can be obtained.

In the present process, the heating treatment (reflow) is performed in the upside down turning state. In this case, when the moisture contained in the frame member FLP is vaporized, the gas (water vapor) generated from the vaporized moisture goes upward, and goes toward the bonding interface between the bonding material BND1 and the frame member FLP (interface between the lower surface FLb and the bonding material BND1 shown in FIG. 4). For this reason, from the viewpoint of suppressing the damage on the resin RES between the lower surface FLb and the glass fibers GC shown in FIG. 4, the flattened lower surface FLb that is almost as flat as the upper surface FLt is also preferable.

As already explained in the above-described section of the wiring substrate preparation process, the roughness Rz of the upper surface FLt and the roughness Rz of the lower surface FLb of the frame member FLP shown in FIG. 4 are substantially equal to each other. Therefore, the roughness Rz of the lower surface FLb of the frame member FLP shown in FIG. 4 is less than the roughness Rz of the upper surface SR1$t$ of the insulating film SR1. Moreover, the roughness Rz of the lower surface FLb of the frame member FLP is less than the roughness Rz of the lower surface SR2$b$ of the insulating film SR2. Most preferably, the roughness Rz of the lower surface FLb of the frame member FLP is less than the roughness Rz of the rear surface CPb of the semiconductor chip CP shown in FIG. 3. Therefore, in the solder ball mounting process, the damage on the resin RES can be suppressed. Thus, the peeling of the bonding interface between the frame member FLP and the bonding material BND1 caused by the damage on the resin RES can be suppressed.

Figure 18:
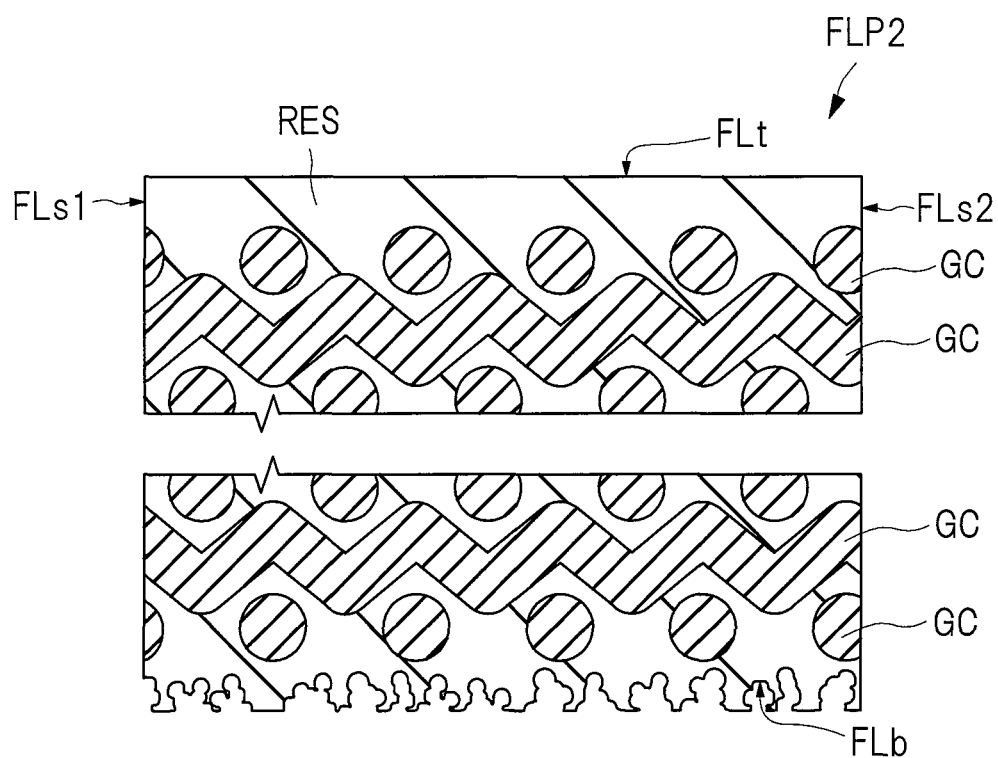
FIG. 18 is a cross-sectional view showing a modified example of the frame member shown in FIG. 6.

However, as described above, the damage on the resin caused by the heating treatment can be suppressed by making the temperature-rising time slow. For example, in the solder ball mounting process, when the process temperature is made to rise to the fusing temperature of the solder component after performing a drying process of slowly vaporizing the moisture contained in the frame member FLP at a temperature lower than a fusing temperature of the solder component, the damage on the resin RES can be suppressed. Therefore, as a modified example, the roughness Rz of the lower surface FLb may be larger than the roughness of the upper surface FLt as similar to that of a frame member FLP2 shown in FIG. 18. In other words, it is required to preferentially flatten the upper surface FLt of the frame member FLP2 rather than the lower surface FLb. For this reason, in the frame member FLP2, the roughness Rz of the upper surface FLt is less than the roughness of the lower surface FLb. FIG. 18 is a cross-sectional view showing a modified example of the frame member shown in FIG. 6.

<Inspection>

Next, in an inspection process shown in FIG. 7, necessary tests such as an appearance test and an electrical test are executed on the semiconductor device PKG1. A semiconductor device that has been passed the tests as an inspections result can be shipped as a product.

Second Embodiment

Figure 19:
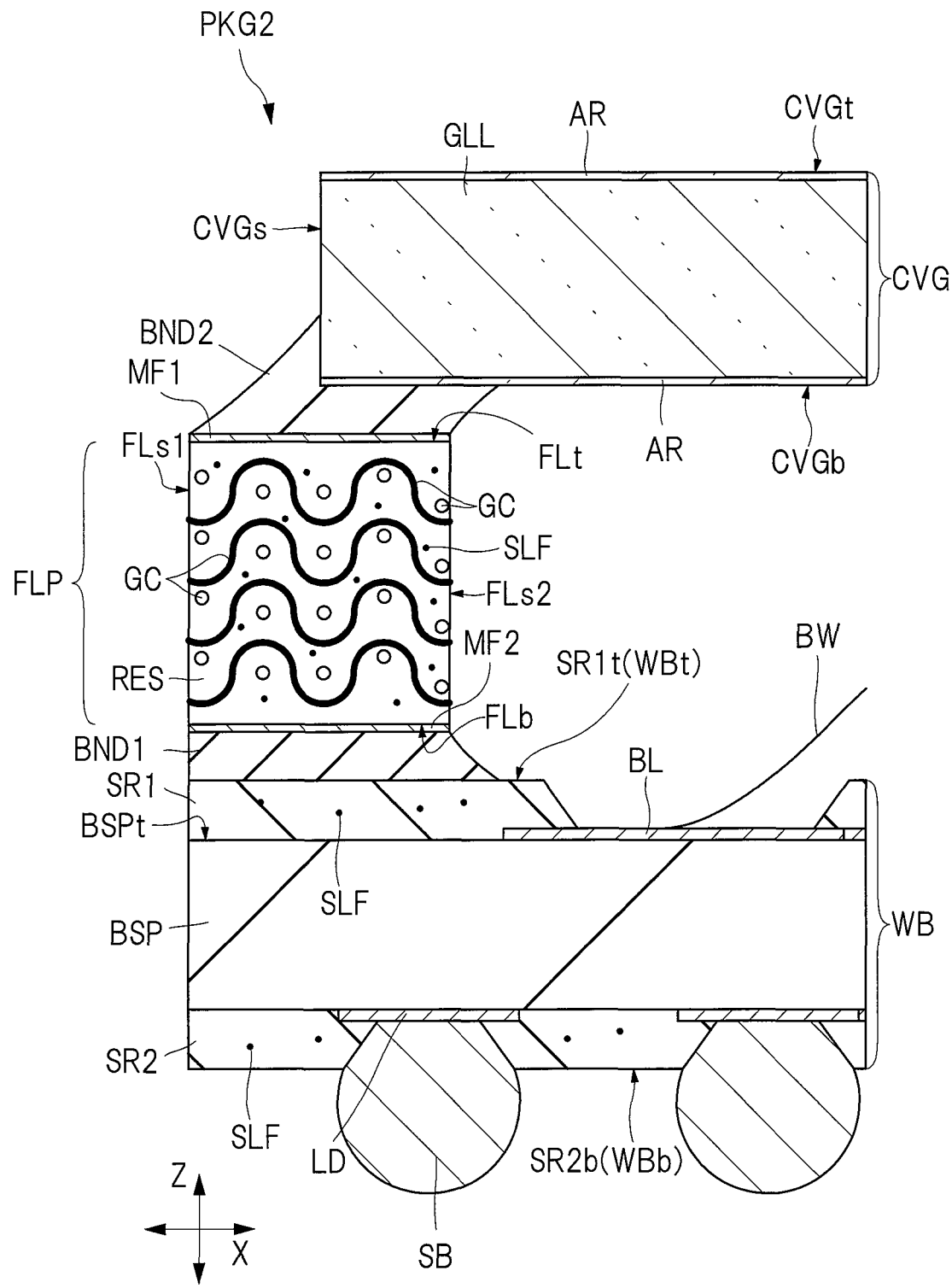
FIG. 19 is an enlarged cross-sectional view of a periphery of the frame member included in the semiconductor device of the present embodiment according to a modified example of FIG. 4.

Next, as a second embodiment, a mode in which another member is interposed between the frame member FLP and the bonding material BND2 will be explained. FIG. 19, which shows a modified example of FIG. 4, is an enlarged cross-sectional view showing the periphery of the frame member included in the semiconductor device of the present embodiment. FIG. 20 is an enlarged cross-sectional view showing an upper surface and a lower surface of the frame member shown in FIG. 19.

The semiconductor device PKG2 shown in FIG. 19 is different from the semiconductor device PKG1 shown in FIG. 4 in that a metal film (member) MF1 covering the upper surface FLt is interposed between the upper surface FLt of the frame member FLP and the bonding material BND2. Moreover, the semiconductor device PKG2 shown in FIG. 19 is different from the semiconductor device PKG1 shown in FIG. 4 in that a metal film (member) MF2 covering the lower surface FLb is interposed between the lower surface FLb of the frame member FLP and the bonding material BND1.

Each of the metal film MF1 and the metal film MF2 is a metal film that is press-bonded onto the resin member PPB in the metal film press-bonding process that has been explained in the first embodiment by using FIG. 10. Each of the metal film MF1 and the metal film MF2 is, for example, a copper foil, and contains copper as a main component. The semiconductor device PKG2 shown in FIG. 19 can be obtained by eliminating the metal film removing process shown in FIG. 10.

As shown in FIG. 20, the metal film MF1 has a lower surface (surface, main surface) MFb1 that faces to the upper surface FLt of the frame member FLP and an upper surface (surface, main surface) MFt1 that is opposite to the lower surface MFb1. Moreover, in the thickness direction of the metal film MF1 (Z-direction), the metal film MF1 has an outer side surface (surface, side surface) MFs1 and an inner side surface (surface, side surface) MFs2 that are positioned between the upper surface MFt1 and the lower surface MFb1. The metal film MF1 has a plane frame shape as similar to the frame member FLP, an outer side surface of the frame shape is the outer side surface MFs1, and a side surface opposite to the outer side surface MFs1 is the inner side surface MFs2.

Similarly, the metal film MF2 has an upper surface (surface, main surface) MFt2 that faces to the lower surface FLb of the frame member FLP and a lower surface (surface, main surface) MFb2 that is opposite to the upper surface MFt2. Moreover, in the thickness direction of the metal film MF2 (Z-direction), the metal film MF2 has an outer side surface (surface, side surface) MFs3 and an inner side surface (surface, side surface) MFs4 that are positioned between the upper surface MFt2 and the lower surface MFb2. The metal film MF2 has a plane frame shape as similar to the frame member FLP, an outer side surface of the frame shape is the outer side surface MFs3, and a side surface opposite to the outer side surface MFs3 is the inner side surface MFs4.

In the example shown in FIG. 19 and FIG. 20, the metal film MF1 covers the entire upper surface FLt of the frame member FLP. For this reason, the bonding material BND2 is not made in contact with the upper surface FLt of the frame member FLP. Moreover, each of the outer side surface MFs1 and the inner side surface MFs2 of the metal film MF1 is exposed from the bonding material BND2. Similarly, the metal film MF2 covers the entire lower surface FLb of the frame member FLP. For this reason, the bonding material BND1 is not made in contact with the lower surface Fb of the frame member FLP. Moreover, each of the outer side surface MFs3 and the inner side surface MFs4 of the metal film MF2 is exposed from the bonding material BND1.

As explained with reference to FIG. 10, the metal film MF1 and the metal film MF2 are press-bonded while the thermosetting resin component contained in the resin member PPB is half-cured. For this reason, the bonding strength between the metal films MF1, MF2 and the frame member FLP shown in FIG. 20 can be ensured to be equal to or larger than the bonding strength between the upper surface FLt of the frame member FLP and the bonding material BND1 shown in FIG. 4.

Moreover, even if the moisture contained in the glass fibers GC is vaporized, the gas generated by the vaporization of the moisture does not pass via the metal film MF1 and the metal film MF2. Therefore, no bubbles infiltrate into the bonding interface between the metal film MF1 and the bonding material BND2 and the bonding interface between the metal film MF2 and the bonding material BND1, and the peeling of the bonding materials BND1 and BND2 caused by the vaporization of the moisture can be suppressed.

Moreover, as explained in the above-described first embodiment, the upper surface FLt of the frame member FLP is flattened to be almost as flat as the upper surface SR1t of the insulating film SR1 or flatter than the upper surface SR1t shown in FIG. 4. In other words, the flatness of the upper surface FLt of the frame member FLP is equal to the flatness of the upper surface SR1t of the insulating film SR1 or larger than the flatness of the upper surface SR1t. In still other words, the roughness of the upper surface FLt of the frame member FLP is equal to less than the roughness of the upper surface SR1t of the insulating film SR1. Furthermore, most preferably, the roughness Rz of the upper surface FLt of the frame member FLP is equal to or smaller than the roughness Rz of the rear surface CPb of the semiconductor chip CP shown in FIG. 3. Thus, even if the moisture contained in the glass fibers GC is vaporized, the damage on the resin RES can be suppressed, and therefore, the filtration of the gas between the metal film MF1 and the upper surface FLt of the frame member FLP can be suppressed. Thus, the peeling between the metal film MF1 and the frame member FLP can be suppressed.

Moreover, although the overlapping explanations will be omitted, because of same reason, the peeling of the metal film MF2 can be suppressed by reducing the roughness Rz of (in other words, by flattening) the lower surface FLb of the frame member FLP. The degree of the roughness Rz of the lower surface FLb of the frame member FLP is as explained in the first embodiment.

Furthermore, as described above, no water vapor infiltrates into the bonding interface between the metal film MF1 and the bonding material BND2 and the bonding interface between the metal film MF2 and the bonding material BND1, and therefore, the roughness Rz of each of the upper surface MFt1 of the metal film MF1 and the lower surface MFb2 of the metal film MF2 can be set to an arbitrary value. In other words, the influence on the peeling of the bonding materials BND2 and BND1 from the upper surface MFt1 of the metal film MF1 and the lower surface MFb2 of the metal film MF2 is not different between the case with the flattening process and the case without the flattening process. Meanwhile, as explained in the first embodiment, the roughness Rz of the upper surface FLt of the frame member FLP can be reduced by reducing the roughness Rz of the lower surface MFb1 of the metal film MF1. Therefore, depending on the degree of the flattening process to the lower surface MFb1 of the metal film MF1, the roughness Rz of the upper surface FLt of the frame member FLP becomes equal to or smaller than the roughness Rz of the upper surface MFt1 of the metal film MF1 in some cases as shown in an example of FIG. 20.

Similarly, the roughness Rz of the lower surface FLb of the frame member FLP can be reduced by reducing the roughness Rz of the upper surface MFt2 of the metal film MF2. Therefore, depending on the degree of the flattening process to the upper surface MFt2 of the metal film MF2, the roughness Rz of the lower surface FLb of the frame member FLP becomes equal to or smaller than the roughness Rz of the lower surface MFb2 of the metal film MF2 in some cases as shown in the example of FIG. 20.

Figure 21:
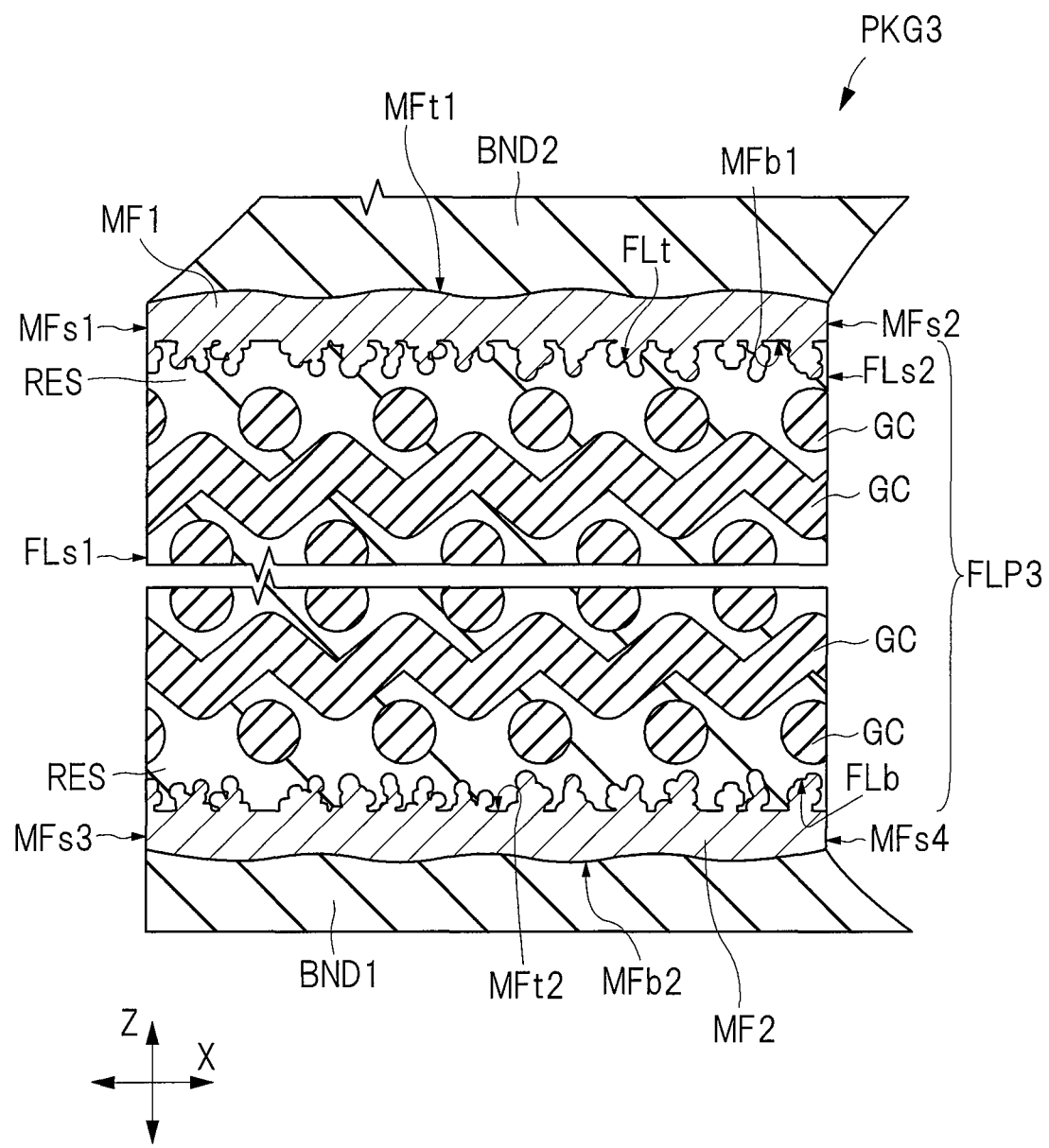
FIG. 21 is an enlarged cross-sectional view of peripheries of the upper surface and the lower surface of the frame member included in the semiconductor device according to a modified example of FIG. 20.

Moreover, as described above, the metal film MF1 and the metal film MF2 are press-bonded while the thermosetting resin component contained in the resin member PPB is half-cured. For this reason, even when the roughness Rz of the upper surface FLt (and the lower surface FLb) of the frame member FLP is large as seen in, for example, a semiconductor device PKG3 shown in FIG. 21, the peeling of the metal film MF1 (and the metal film MF2) can be suppressed. FIG. 21 is an enlarged cross-sectional view showing periphery of an upper surface and a lower surface of a frame member included in a semiconductor device serving as a modified example of FIG. 20.

In an example shown in FIG. 21, the lower surface MFb1 of the metal film MF1 (and the upper surface MFt2 of the metal film MF2) is subjected to a roughening treatment. For this reason, a roughness Rz of an upper surface FLt (and a lower surface FLb) of a frame member FLP3 is about 7 to 8 μm which is larger than the roughness Rz of the upper surface SR1t of the insulating film SR1 shown in FIG. 4. However, since the metal film MF1 (and the metal film MF2) is press-bonded before the resin component contained in the resin member PPB (see FIG. 10) is cured, the resin component of the resin member PPB is easily buried into a gap in the lower surface MFb1 of the metal film MF1 (and the upper surface MFt2 of the metal film MF2). For this reason, the metal material is tightly in contact with a portion having a small thickness of the resin RES in the vicinity of the upper surface FLt (or the lower surface FLb) of the frame member FLP3. In other words, the portion having the small thickness of the resin RES is reinforced by the metal material forming the metal film MF1 (or the metal film MF2). Therefore, the portion having the small thickness of the resin RES is difficult to be damaged even when the moisture is vaporized from the glass fibers GC shown in FIG. 21 in the frame member mounting process, the die bonding process, the ultraviolet-ray irradiation process or the solder ball mounting process shown in FIG. 7 explained in the first embodiment. Therefore, in the case of the modified example shown in FIG. 21, the filtration of the bubbles into the upper surface FLt (or the lower surface FLb) of the frame member FLP can be suppressed more than the case in which the bonding material BND1 or BND2 is adhered to the frame member FLP3.

Moreover, from the viewpoint of suppressing oxidation of the metal film MF1 and the metal film MF2, a mode in which the metal film MF1 and the metal film MF2 are not exposed as seen in a semiconductor device PKG4 shown in FIG. 22 is preferable. FIG. 22 is an enlarged cross-sectional view showing periphery of an upper surface and a lower surface of a frame member included in a semiconductor device serving as another modified example of FIG. 20. The metal film MF1 shown in FIG. 22 is different from the metal film MF1 shown in FIG. 20 in that each of the outer side surface MFs1 and the inner side surface MFs2 is located between the outer side surface FLs1 and the inner side surface FLs2 of the frame member FLP when seen in a plan view and is covered with the bonding material BND2. Moreover, the metal film MF2 shown in FIG. 22 is different from the metal film MF2 shown in FIG. 20 in that each of the outer side surface MFs3 and the inner side surface MFs4 is located between the outer side surface FLs1 and the inner side surface FLs2 of the frame member FLP when seen in a plan view and is covered with the bonding material BND1.

Each of the metal film MF1 and the metal film MF2 shown in FIG. 22 is obtained by selectively removing a part of each of the metal film MF1 and the metal film MF2 in the metal film removing process (see FIG. 10) explained in the above-described embodiment. In the case of the semiconductor device PKG4, since each of the metal film MF1 and the metal film MF2 is not exposed, oxidation of these metal film can be suppressed.

Moreover, in the case of the semiconductor device PKG4, a part (a portion continued to the outer side surface FLs1 and a portion continued to the inner side surface FLs2) of the upper surface FLt of the frame member FLP is made in contact with the bonding material BND2. However, the gas generated by the vaporization of the moisture of the glass fibers GC preferentially flows toward a passage having a relatively small static pressure. Therefore, in the vicinity of the outer side surface FLs1 and in the vicinity of the inner side surface FLs2, the gas is easily discharged from the side surface of the frame member FLP. That is, a pressure to be applied to a portion that is made in tightly contact with the bonding material BND2 in the upper surface FLt of the frame member FLP shown in FIG. 22 is small even when the moisture of the glass fibers GC is vaporized, and therefore the damage on the resin RES can be suppressed.

Although the overlapping explanation is omitted, the same goes for a portion made in tightly contact with the bonding material BND1 in the lower surface FLb of the frame member FLP.

Moreover, although the illustration is omitted, the frame member FLP shown in FIG. 22 may be replaced by a frame member FLP3 shown in FIG. 21 as a modified example of the semiconductor device PKG4. In this case, as described above, the pressure to be applied to the portion of the upper surface FLt that is made in tightly contact with the bonding material BND2 is small even when the moisture of the glass fibers GC is vaporized, and therefore, the damage on the resin RES can be suppressed.

In FIG. 19 to FIG. 22, note that the mode in which both of the metal film MF1 and the metal film MF2 are provided has been explained. However, as a modified example, either one of the metal film MF1 and the metal film MF2 may be provided. For example, as described above, the manufacturing processes of the semiconductor device include many processes such as the heating process and the ultraviolet-ray irradiation process while the bonding material BND2 is disposed to be higher than the bonding material BND1. Therefore, when an act to prevent the peeling of the bonding material BND2 is preferentially taken, the metal film MF1 may be provided but the metal film MF2 may not be provided, and the lower surface FLb of the frame member FLP may be made in tightly contact with the bonding material BND1. In this case, the thickness of the semiconductor package can be reduced by the metal film MF2 that is only but still one layer.

Moreover, FIG. 19 to FIG. 22 show the metal film as the member interposed between the frame member FLP and the bonding material BND2 and as the member interposed between the frame member FLP and the bonding material BND1. However, as seen in a semiconductor device PKG5 shown in FIG. 23, a resin film NMF1 may be interposed between the frame member FLP and the bonding material BND2. FIG. 23 is an enlarged cross-sectional view showing periphery of an upper surface and a lower surface of a frame member included in a semiconductor device serving as another modified example of FIG. 20.

The semiconductor device PKG5 shown in FIG. 23 is different from the semiconductor device PKG2 shown in FIG. 20 in that a resin film (member) NMF1 covering the upper surface FLt is interposed between the upper surface FLt of the frame member FLP and the bonding material BND2. Moreover, the semiconductor device PKG5 shown in FIG. 23 is different from the semiconductor device PKG2 shown in FIG. 20 in that a resin film (member) NMF2 covering the lower surface FLb is interposed between the lower surface FLb of the frame member FLP and the bonding material BND1.

The resin film NMF1 shown in FIG. 23 is obtained by performing the metal film removing process shown in FIG. 10, and then, applying and curing, for example, a liquid resin film NMF1 having a viscosity lower than that of the bonding material BND2 shown in FIG. 15 on the upper surface FLt of the resin member PPB. Similarly, the resin film NMF2 is obtained by performing the metal film removing process shown in FIG. 10, and then, applying and curing, for example, a liquid resin film NMF2 having a viscosity lower than that of the bonding material BND2 shown in FIG. 15 on the lower surface FLb of the resin member PPB. Each of the resin film NMF1 and the resin film NMF2 may contain, for example, a thermosetting resin or an ultraviolet-ray curable resin.

In the case of the semiconductor device PKG5 shown in FIG. 23, when the resin film is formed after removing the metal film, the number of processes is larger than that of the frame member assembly process explained by using FIG. 10 and FIG. 11. However, the resin film NMF1 is more advantageous than the metal film MF1 shown in FIG. 20 in that the resin film NMF1 is difficult to be oxidized even when being exposed to the outside. Moreover, even when the roughness Rz of the upper surface FLt is large as seen in the frame member FLP3 explained by using FIG. 21, if a liquid resin having a low viscosity is used as the material for the resin films NMF1 and NMF2, the resin can be buried into irregularities of the upper surface FLt, and therefore, a portion having the small thickness of the resin RES is reinforced by the cured resin forming the resin films NMF1 and NMF2.

In the foregoing, the invention made by the present inventor has been concretely described based on the embodiments. However, it is needless to say that the present invention is not limited to the foregoing embodiments and various modifications and alterations can be made within the scope of the present invention. While note that some modified examples have been explained in the above-described embodiments, typical modified examples other than the modified examples explained in the above-described embodiments will be explained below.

Modified Example 1

For example, the above-described first embodiment and second embodiment have been explained by exemplifying the image sensor package in which the semiconductor chip serving as the image sensor is mounted on the wiring substrate as the example of the semiconductor device in which the semiconductor chip is mounted on the wiring substrate and is surrounded by the frame member and the cover member. However, the invention is applicable to, for example, not only the image sensor package but also various modified examples as long as the same configuration as that of the semiconductor device explained in the first embodiment and the second embodiment is provided.

Modified Example 2

Moreover, for example, the above-described first embodiment and second embodiment have been explained by exemplifying a mode in which the cover member CVG is the glass plate (including a plate having a reflection preventive film formed thereon). The glass plate is a generally known material as the cover member CVG in terms of its transparency to visible light and high heat resistance. However, the cover member CVG includes not only the glass plate but also various modified examples. For example, even a plate comprised of resin can be used as the cover member CVG in place of the glass plate as long as the plate is suitable for necessary specifications of the transparency to visible light and the heat resistance.

Modified Example 3

Moreover, for example, in the modes explained in the above-described first embodiment and second embodiment, the frame member FLP is formed by curing the prepreg material prepared by impregnating the glass fiber sheet formed by molding the glass fibers GC into the sheet shape with the resin RES that is the epoxy-based thermosetting resin as similar to the above-described base member BSP. However, in the member having the characteristics of absorbing the peripheral moisture and of allowing the moisture to vaporize by the heating treatment and the ultraviolet-ray irradiation process, the same problems as the problems explained in the first embodiment or others occur in some cases. For example, the resin RES shown in FIG. 6 is explained as the thermosetting resin. However, the resin may be a resin such as a liquid crystal polymer and polyether ether ketone. Moreover, the resin RES may contain an additive material such as carbon powder (carbon black) in addition to the above-described materials.

Modified Example 4

Moreover, for example, various modified examples have been explained. However, a part or the entire of the above-explained modified examples can be combined with one another and be applied within the consistent scope of the gist of the explanations about the respective modified examples.

The above-described plurality of embodiments include the following modes.

(Additional Note 1)

A method of manufacturing a semiconductor device includes the following steps.

(a) a step of preparing a wiring substrate including a base member that has a first upper surface and a first lower surface opposite to the first upper surface and that is comprised of an insulating material, a first terminal formed on the first upper surface of the base member, and a first insulating film that has a second lower surface facing to the first upper surface and a second upper surface opposite to the second lower surface and that is formed on the first upper surface such that the first terminal is exposed. Here, a frame member having a third lower surface and a third upper surface opposite to the third lower surface is fixed on the second upper surface of the first insulating film via a first bonding material while the second upper surface and the third lower surface face to each other, a first member covering the third upper surface is disposed on the third upper surface of the frame member, and the frame member is comprised of a first resin containing glass fibers.

(b) after the step (a), a step of fixing a semiconductor chip having a main surface that has a light-receiving part and a rear surface opposite to the main surface, in a region surrounded by the frame member of the second upper surface via a die bonding material such that the rear surface faces to the second upper surface; having a fourth lower surface and a fourth upper surface opposite to the fourth lower surface, on a fifth upper surface of the first member via a second bonding material such that the fourth lower surface faces to the second upper surface and such that the semiconductor chip is covered; and (d) after the step (c), a step of curing the second bonding material by irradiating the second bonding material with an ultraviolet ray.

(Additional Note 2)

A semiconductor device includes: a wiring substrate; a frame member; a semiconductor chip; a cover member; and a first member. The wiring substrate includes: a base member having a first upper surface and a first lower surface opposite to the first upper surface; a first terminal formed on the first upper surface of the base member; and a first insulating film having a second lower surface facing to the first upper surface and a second upper surface opposite to the second lower surface and being formed on the first upper surface such that the first terminal is exposed. The frame member has a third lower surface and a third upper surface opposite to the third lower surface, and is fixed on the second upper surface of the first insulating film of the wiring substrate via a first bonding material while the second upper surface of the first insulating film and the third lower surface face to each other. The semiconductor chip has a main surface having a light-receiving part and a rear surface opposite to the main surface, and is mounted in a region surrounded by the frame member of the second upper surface such that the rear surface faces to the second upper surface of the first insulating film. The cover member has a fourth lower surface and a fourth upper surface opposite to the fourth lower surface, and is mounted on the third upper surface of the frame member via a second bonding material such that the fourth lower surface faces to the second lower surface of the first insulating film and such that the semiconductor chip is covered. The first member is interposed between the third upper surface of the frame member and the first bonding material, and covers the third upper surface. The frame member is comprised of a first resin with which glass fibers are impregnated.

What is claimed is:

1. A method of manufacturing a semiconductor device comprising the steps of:
   (a) providing a wiring substrate including a base member that has a first upper surface and a first lower surface opposite to the first upper surface and that is comprised of an insulating material, a first terminal formed on the first upper surface of the base member, and a first insulating film that has a second lower surface facing to the first upper surface and a second upper surface opposite to the second lower surface and that is formed on the first upper surface such that the first terminal is exposed from the first insulating film,
   wherein:
      a frame member having a third lower surface and a third upper surface opposite to the third lower surface is fixed on the second upper surface of the first insulating film via a first bonding material such that the second upper surface and the third lower surface face to each other,
      the frame member is comprised of a first resin containing glass fibers, and
   a roughness of the third upper surface of the frame member is equal to or less than a roughness of the second upper surface of the first insulating film;
   (b) after the step (a), fixing a semiconductor chip that has a main surface having a light-receiving part and a rear surface opposite to the main surface in a region, which is surrounded by the frame member, of the second upper surface via a die bonding material such that the rear surface faces the second upper surface;
   (c) after the step (b), fixing a cover member that has a fourth lower surface and a fourth upper surface opposite to the fourth lower surface on the third upper surface of the frame member via a second bonding material such that the fourth lower surface faces the second upper surface and such that the semiconductor chip is covered with the cover member; and
   (d) after the step (c), curing the second bonding material by irradiating the second bonding material with an ultraviolet ray.

2. The method of manufacturing the semiconductor device according to claim 1,
   wherein the step (a) includes the steps of:
   (a1) immersing a glass fiber sheet in a resin layer such that the glass fiber sheet is impregnated with the first resin;
   (a2) after the step (a1), sandwiching a resin member containing the glass fiber sheet by a first metal film and a second metal film, and press-bonding the first metal film, the second metal film and the resin member with one another; and
   (a3) removing each of the first metal film and the second metal film after the resin member has been cured such that the third upper surface and the third lower surface are exposed.

3. The method of manufacturing the semiconductor device according to claim 1,
wherein the wiring substrate includes a second terminal formed on the first lower surface of the base member, and
the method further includes the step of:
(e) after the step (d), joining a solder ball to the second terminal.

4. The method of manufacturing the semiconductor device according to claim 1,
wherein the first insulating film does not contain the glass fibers.

5. A semiconductor device comprising:
a wiring substrate; a frame member; a semiconductor chip; and a cover member,
the wiring substrate including: a base member that has a first upper surface and a first lower surface opposite to the first upper surface; a first terminal formed on the first upper surface of the base member; and a first insulating film that has a second lower surface facing to the first upper surface and a second upper surface opposite to the second lower surface and that is formed on the first upper surface such that the first terminal is exposed,
the frame member that has a third lower surface and a third upper surface opposite to the third lower surface, and that is fixed on the second upper surface of the first insulating film of the wiring substrate via a first bonding material such that the second upper surface of the first insulating film and the third lower surface face to each other,
the semiconductor chip that has a main surface that has a light-receiving part and a rear surface opposite to the main surface, and that is fixed in a region, which is surrounded by the frame member of the second upper surface via a die bonding material such that the rear surface faces to the second upper surface of the first insulating film, and
the cover member that has a fourth lower surface and a fourth upper surface opposite to the fourth lower surface, and that is fixed on the third upper surface of the frame member via a second bonding material such that the fourth lower surface faces the second upper surface of the first insulating film and such that the semiconductor chip is covered,
wherein the frame member is composed of a first resin containing glass fibers, and
a roughness of the third upper surface of the frame member is equal to or less than a roughness of the second upper surface of the first insulating film.

6. The semiconductor device according to claim 5,
wherein the roughness of the third upper surface of the frame member is equal to or less than a roughness of the rear surface of the semiconductor chip.

7. The semiconductor device according to claim 5,
wherein the frame member has a third inner side surface and a third outer side surface that are positioned between the third upper surface and the third lower surface in a thickness direction, and
a part of the glass fibers is exposed from the first resin on the third outer side surface.

8. The semiconductor device according to claim 5,
wherein the frame member has a third inner side surface and a third outer side surface that are positioned between the third upper surface and the third lower surface in a thickness direction,
the cover member has a fourth side surface that is positioned between the fourth upper surface and the fourth lower surface in a thickness direction, and
the fourth side surface is positioned between the third inner side surface and the third outer side surface when seen in a plan view.

9. The semiconductor device according to claim 5,
wherein a first member covering the third upper surface is interposed between the third upper surface of the frame member and the first bonding material.

10. The semiconductor device according to claim 9,
wherein the frame member has a third inner side surface and a third outer side surface that are positioned between the third upper surface and the third lower surface in a thickness direction,
the first member is composed of a metal material containing copper as a main component, and has a fifth lower surface facing to the third upper surface, a fifth upper surface opposite to the fifth lower surface, and a fifth inner side surface and a fifth outer side surface that are positioned between the fifth upper surface and the fifth lower surface in the thickness direction, and,
when seen in a plan view, each of the fifth outer side surface and the fifth inner side surface is positioned between the third inner side surface and the third outer side surface, and the fifth outer side surface is covered by the first bonding material.

11. The semiconductor device according to claim 9,
wherein the first member has a fifth lower surface facing to the third upper surface and a fifth upper surface opposite to the fifth lower surface, and a roughness of the fifth upper surface is larger than a roughness of the third upper surface of the frame member.

12. The semiconductor device according to claim 9,
wherein a second member covering the third lower surface is interposed between the third lower surface of the frame member and the second bonding material.

13. The semiconductor device according to claim 5,
wherein the second bonding material is an ultraviolet-ray curable resin, and
the second bonding material and the third upper surface of the frame member are made in tightly contact with each other.

14. The semiconductor device according to claim 13,
wherein a roughness of the third upper surface of the frame member is less than a roughness of the third lower surface of the frame member.

15. The semiconductor device according to claim 5,
wherein the wiring substrate includes a second terminal formed on the first lower surface of the base member,
a solder ball is joined to the second terminal, and
a roughness of the third lower surface of the frame member is equal to or less than a roughness of the second upper surface of the first insulating film.

16. The semiconductor device according to claim 5,
wherein the first insulating film does not contain the glass fibers.

* * * * *